United States Patent
Lee et al.

(10) Patent No.: US 11,799,004 B2
(45) Date of Patent: *Oct. 24, 2023

(54) SEMICONDUCTOR DEVICE

(71) Applicant: SAMSUNG ELECTRONICS CO., LTD., Suwon-si (KR)

(72) Inventors: Heon Bok Lee, Suwon-si (KR); Dae Yong Kim, Yongin-si (KR); Wan Don Kim, Seongnam-si (KR); Jeong Hyuk Yim, Seoul (KR); Won Keun Chung, Seoul (KR); Hyo Seok Choi, Hwaseong-si (KR); Sang Jin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/694,759

(22) Filed: Mar. 15, 2022

(65) Prior Publication Data

US 2022/0199790 A1 Jun. 23, 2022

Related U.S. Application Data

(63) Continuation of application No. 16/695,675, filed on Nov. 26, 2019, now Pat. No. 11,296,196.

(30) Foreign Application Priority Data

Nov. 30, 2018 (KR) .......................... 10-2018-0152262

(51) Int. Cl.
*H01L 29/417* (2006.01)
*H01L 29/66* (2006.01)
(Continued)

(52) U.S. Cl.
CPC .. *H01L 29/41775* (2013.01); *H01L 21/76897* (2013.01); *H01L 29/0847* (2013.01);
(Continued)

(58) Field of Classification Search
CPC ......... H01L 29/41775; H01L 21/76897; H01L 29/0847; H01L 29/41791; H01L 29/6681; H01L 29/7851
See application file for complete search history.

(56) References Cited

U.S. PATENT DOCUMENTS 9,419,013 B1    8/2016 Lee et al.
11,296,196 B2 *  4/2022 Lee .................... H01L 29/7848
(Continued)

FOREIGN PATENT DOCUMENTS

KR    10-2007-0079404 A    8/2007
KR    10-20160116215 A    10/2016

OTHER PUBLICATIONS

Korean Notice of Allowance dated Jan. 18, 2023 for corresponding KR 10-2018-0152262.

*Primary Examiner* — Fernando L Toledo
*Assistant Examiner* — Neil R Prasad
(74) *Attorney, Agent, or Firm* — Lee IP Law, P.C.

(57) ABSTRACT

A semiconductor device includes an active pattern on a substrate, the active pattern extending in a first direction, a gate electrode on the active pattern, the gate electrode extending in a second direction intersecting the first direction and including a first portion and a second portion arranged along the second direction, a first contact plug on the gate electrode, the first contact plug being connected to a top surface of the second portion of the gate electrode, a source/drain region in the active pattern on a sidewall of the gate electrode, and a source/drain contact on the source/drain region, a height of a top surface of the source/drain
(Continued)

contact being higher than a top surface of the first portion of the gate electrode and lower than the top surface of the second portion of the gate electrode.

20 Claims, 40 Drawing Sheets

(51) Int. Cl.
  *H01L 29/08* (2006.01)
  *H01L 21/768* (2006.01)
  *H01L 29/78* (2006.01)
(52) U.S. Cl.
  CPC .... *H01L 29/41791* (2013.01); *H01L 29/6681* (2013.01); *H01L 29/7851* (2013.01)

(56) References Cited

U.S. PATENT DOCUMENTS

| | | |
|---|---|---|
| 2007/0224758 A1 | 9/2007 | Park |
| 2008/0284006 A1 | 11/2008 | Hong et al. |
| 2014/0339610 A1 | 11/2014 | Rashed et al. |
| 2015/0123181 A1 | 5/2015 | Yiang et al. |
| 2015/0332962 A1 | 11/2015 | Chen et al. |
| 2016/0141379 A1 | 5/2016 | Zang et al. |
| 2016/0260669 A1 | 9/2016 | Paak et al. |
| 2016/0365424 A1 | 12/2016 | Basker et al. |
| 2017/0194211 A1 | 7/2017 | Lai et al. |
| 2017/0221891 A1* | 8/2017 | Chen ................ H01L 21/76895 |
| 2017/0271354 A1 | 9/2017 | Kwak |
| 2018/0012839 A1 | 1/2018 | Zang et al. |
| 2018/0083036 A1 | 3/2018 | Agarwal et al. |
| 2018/0096935 A1 | 4/2018 | Kim et al. |
| 2018/0301371 A1 | 10/2018 | Wang et al. |
| 2018/0315652 A1 | 11/2018 | Tsai et al. |

* cited by examiner

SEMICONDUCTOR DEVICE

CROSS-REFERENCE TO RELATED APPLICATION

This application is a continuation of U.S. patent application Ser. No. 16/695,675 filed Nov. 26, 2019, which is incorporated by reference herein in its entirety.

Korean Patent Application No. 10-2018-0152262, filed on Nov. 30, 2018, in the Korean Intellectual Property Office, and entitled: "Semiconductor Device and Method for Fabricating the Same," is incorporated by reference herein in its entirety.

BACKGROUND

1. Field

The present disclosure relates to a semiconductor device and a method for fabricating the same and, more particularly, to a semiconductor device including a gate contact and a source/drain contact and a method for fabricating the same.

2. Description of the Related Art

As one of scaling techniques for increasing the density of semiconductor devices, a multi-gate transistor has been proposed, in which a fin-shaped silicon body is formed on a substrate and a gate is formed on the surface of the silicon body. Since the multi-gate transistor uses a three-dimensional (3D) channel, scaling of the multi-gate transistor can be easily achieved. Further, current control capability can be improved without increasing the gate length of the multi-gate transistor. In addition, a short channel effect (SCE) in which the potential of a channel region is affected by a drain voltage can be effectively suppressed.

SUMMARY

According to aspects of the present disclosure, there is provided a semiconductor device including an active pattern on a substrate, the active pattern extending in a first direction, a gate electrode on the active pattern, the gate electrode extending in a second direction intersecting the first direction and including a first portion and a second portion arranged along the second direction, a first contact plug on the gate electrode, the first contact plug being connected to a top surface of the second portion of the gate electrode, a source/drain region disposed in the active pattern on a sidewall of the gate electrode, and a source/drain contact on the source/drain region, wherein a height of a top surface of the source/drain contact is higher than a top surface of the first portion of the gate electrode and lower than the top surface of the second portion of the gate electrode.

According to aspects of the present disclosure, there is provided a semiconductor device including an active pattern on a substrate, the active pattern extending in a first direction, a gate electrode on the active pattern, the gate electrode extending in a second direction intersecting the first direction, a first contact plug on the gate electrode, the first contact plug being connected to the gate electrode, a source/drain region disposed in the active pattern on a sidewall of the gate electrode, and a second contact plug on the source/drain region, the second contact plug being connected to the source/drain region, wherein the gate electrode includes a first portion arranged along the first direction with the second contact plug and a second portion arranged along the second direction with the first portion and directly connected to the first contact plug, and wherein a height of a top surface of the second portion of the gate electrode is higher than a height of a top surface of the first portion of the gate electrode.

According to aspects of the present disclosure, there is provided a semiconductor device including a first active pattern on a substrate, the first active pattern extending in a first direction, a first gate electrode on the first active pattern, the first gate electrode extending in a second direction intersecting the first direction and including a first portion and a second portion arranged along the second direction, a first contact plug connected to a top surface of the second portion of the first gate electrode, a first source/drain region disposed in the active pattern on a sidewall of the first gate electrode, a first source/drain contact on one sidewall of the first gate electrode and on a top surface of the first source/drain region, and a second contact plug connected to a top surface of the first source/drain contact, wherein a height of a bottom surface of the first contact plug is higher than a height of a top surface of the first source/drain contact, and wherein a height of a bottom surface of the second contact plug is lower than a height of a top surface of the first portion of the first gate electrode.

According to aspects of the present disclosure, there is provided a method for fabricating a semiconductor device, including forming an active pattern on a substrate, the active pattern extending in a first direction, forming a gate electrode on the active pattern, the gate electrode extending in a second direction intersecting the first direction and including a first portion and a second portion arranged along the second direction, a height of a top surface of the first portion being higher than a height of a top surface of the second portion, forming a source/drain region in the active pattern on a sidewall of the gate electrode, forming a source/drain contact on the source/drain region, a height of a top surface of the source/drain contact being higher than a top surface of the first portion of the gate electrode and lower than a top surface of the second portion of the gate electrode, forming a first contact plug to be connected to the top surface of the second portion of the gate electrode, and forming a second contact plug to be connected to the top surface of the source/drain contact.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a semiconductor device according to some embodiments will be described with reference to FIGS. 1 to 25.

Figure 1:
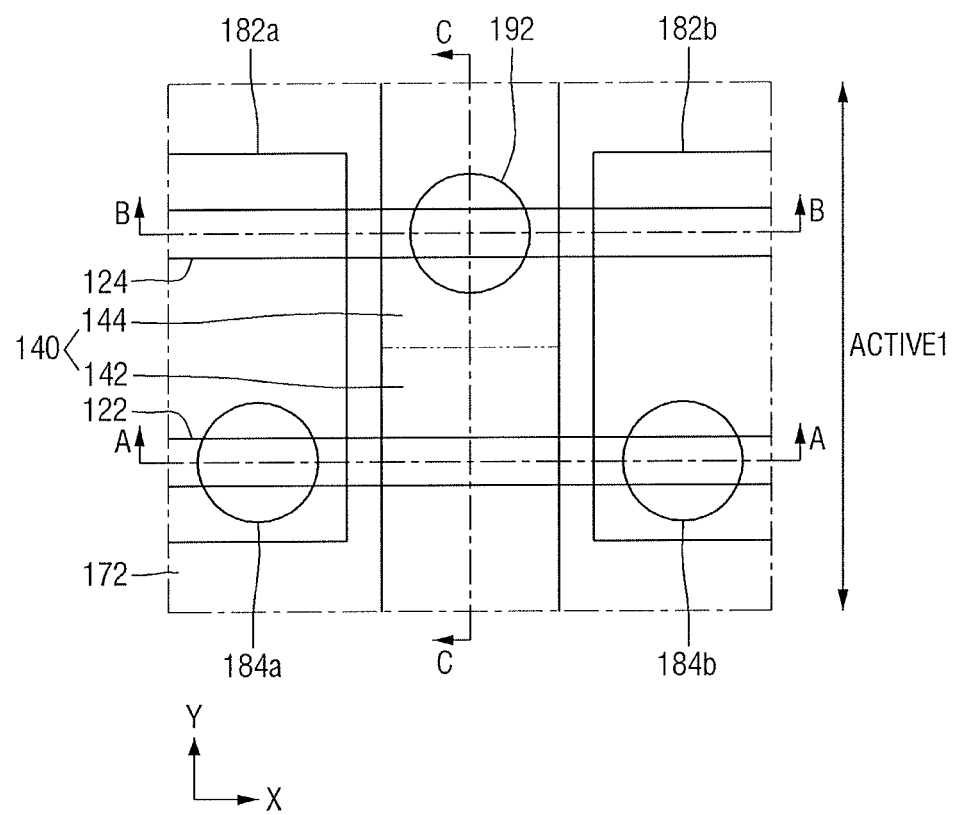
FIG. 1 illustrates a layout diagram of a semiconductor device according to some embodiments.
Figure 2:
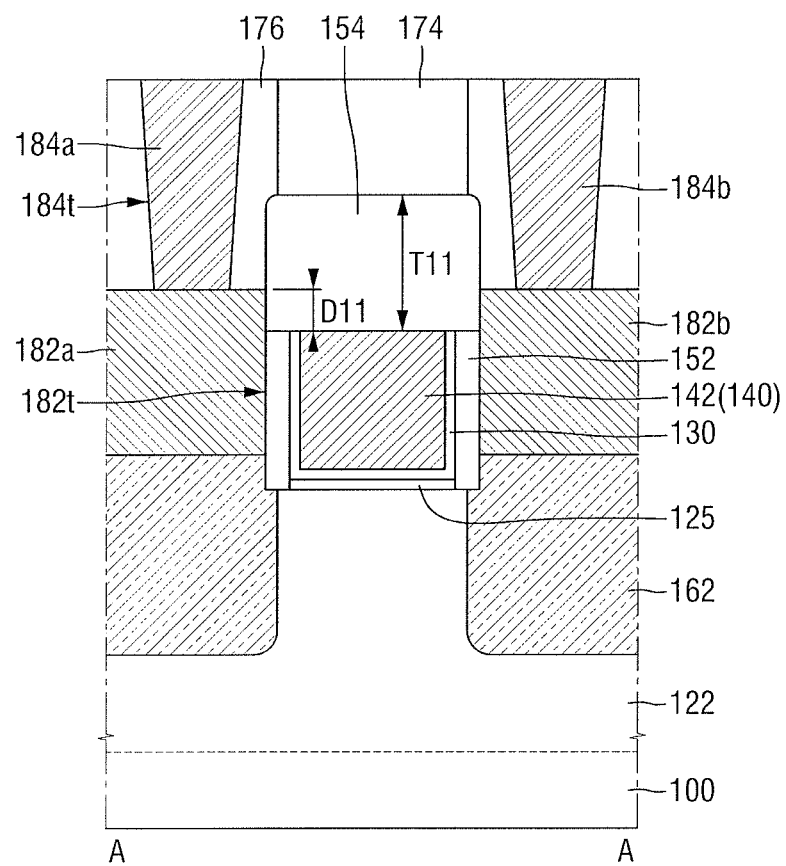
FIG. 2 illustrates a cross-sectional view taken along line A-A of FIG. 1.
Figure 3:
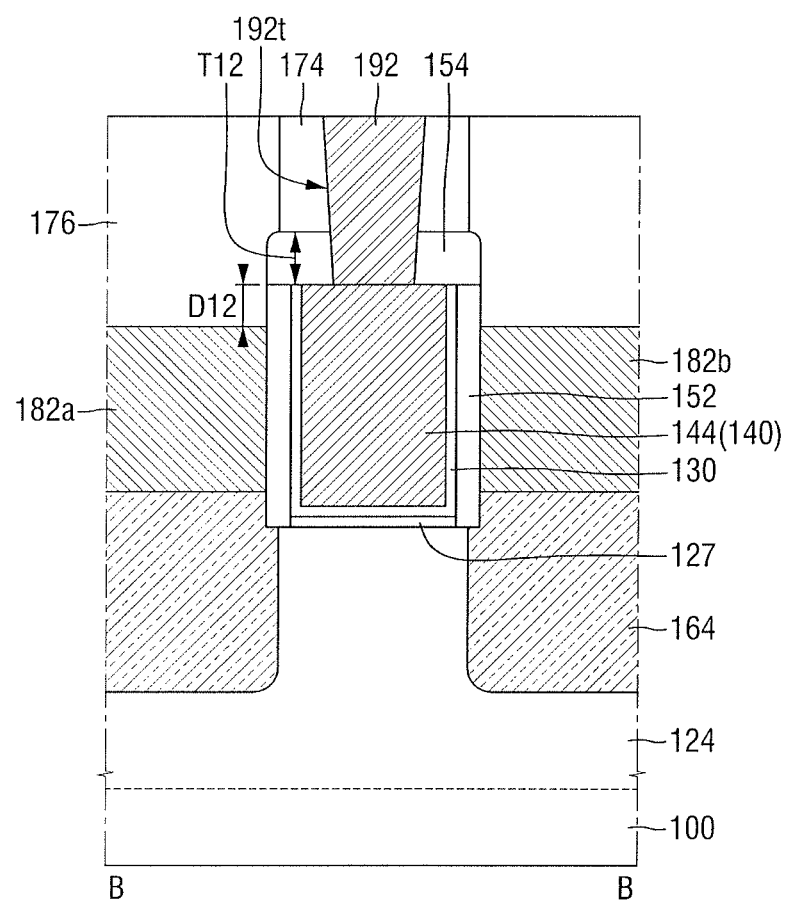
FIG. 3 illustrates a cross-sectional view taken along line B-B of FIG. 1.
Figure 4:
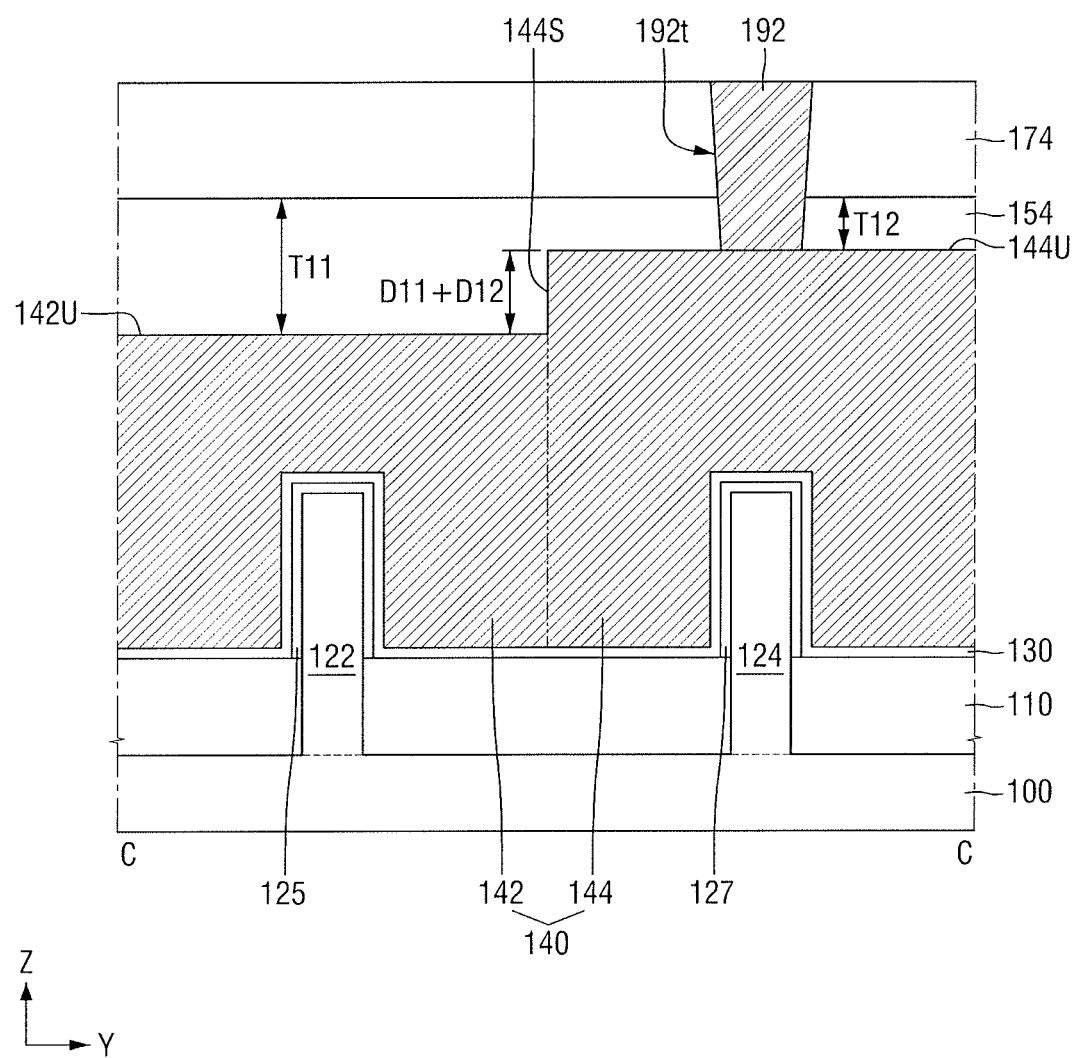
FIG. 4 illustrates a cross-sectional view taken along line C-C of FIG. 1.
Figure 5:
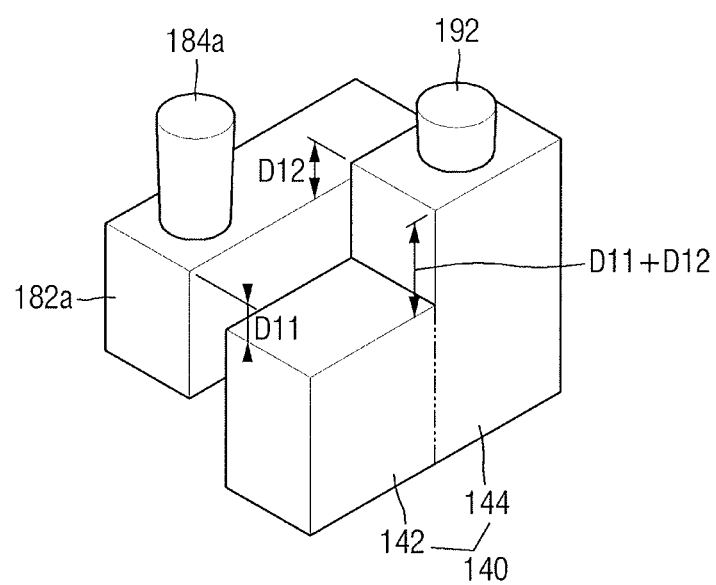
FIG. 5 illustrates a schematic perspective view of a gate electrode, a source/drain contact, and a contact plug of FIG. 1.

FIG. 1 is a layout diagram explaining a semiconductor device according to some embodiments. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1. FIG. 5 is a schematic perspective view illustrating a gate electrode, source/drain contacts, and a contact plug of FIG. 1.

In the drawings relating to a semiconductor device according to some embodiments, e.g., a fin-type transistor (finFET) including a fin-shaped channel region is illustrated, but embodiments are not limited thereto. Further, the semiconductor device according to some embodiments may include a tunneling field effect transistor (TFET), a bipolar junction transistor, a lateral double-diffused metal oxide semiconductor (LDMOS) transistor, and the like.

Referring to FIGS. 1 to 5, a semiconductor device according to some embodiments includes a substrate 100, a first active pattern 122, a second active pattern 124, a field insulating layer 110, a first gate electrode 140, a gate dielectric layer 130, gate spacers 152, a gate capping pattern 154, a first source/drain region 162, a second source/drain region 164, a first interlayer insulating film 172, a second interlayer insulating film 174, a first source/drain contact 182a, a second source/drain contact 182b, a first contact plug 192, a second contact plug 184a, and a third contact plug 184b.

The substrate 100 may include, e.g., bulk silicon or a silicon-on-insulator (SOI). The substrate 100 may be a silicon substrate, or may include other materials, e.g., silicon germanium, indium antimonide, lead tellurium compound, indium arsenide, indium phosphide, gallium arsenide, or gallium antimonide. Alternatively, the substrate 100 may have an epitaxial layer formed on a base substrate. Hereinafter, for simplicity of description, it is assumed that the substrate 100 is a silicon substrate.

The first active pattern 122 and the second active pattern 124 may be formed on the substrate 100. In addition, the first active pattern 122 and the second active pattern 124 may extend in a first direction X. For example, the first active pattern 122 and the second active pattern 124 may be spaced apart from each other along a second direction Y intersecting the first direction X.

The substrate 100 may include a first active region ACTIVE1. An active semiconductor device, e.g., a transistor, may be formed in the first active region ACTIVE1. For example, the first active pattern 122 and the second active pattern 124 may be formed on the first active region ACTIVE1 of the substrate 100.

For example, in the drawings relating to a semiconductor device according to some embodiments, a fin-type transistor (finFET) including a fin-shaped channel region is illustrated. For example, each of the first active pattern 122 and the second active pattern 124 may include a fin-shaped pattern. For example, each of the first active pattern 122 and the second active pattern 124 may protrude from the top surface of the substrate 100 and be elongated in the first direction X. The first active pattern 122 and the second active pattern 124 may be part of, e.g., integral with, the substrate 100 and may include an epitaxial layer grown from the substrate 100.

The first active pattern 122 and the second active pattern 124 may include, e.g., silicon or germanium, which is an elemental semiconductor material. In addition, the first active pattern 122 and the second active pattern 124 may include a compound semiconductor, e.g., a Group IV-IV compound semiconductor or a Group III-V compound semiconductor.

The field insulating layer 110 may be formed on the substrate 100. In some embodiments, the field insulating layer 110 may cover a portion of the sidewalls of the first active pattern 122 and a portion of the sidewalls of the second active pattern 124. For example, as shown in FIG. 4, the first active pattern 122 and the second active pattern 124 may be defined by the field insulating layer 110. The field insulating layer 110 may include, e.g., at least one of silicon oxide, silicon nitride, silicon oxynitride and a combination thereof, but embodiments are not limited thereto.

The first gate electrode 140 may be formed on the first active pattern 122 and the second active pattern 124. The first gate electrode 140 may intersect the first active pattern 122 and the second active pattern 124. For example, the first gate electrode 140 may be elongated in the second direction Y.

The first gate electrode 140 may include a first portion 142 and a second portion 144, the top surfaces of which have different heights. For example, as shown in FIG. 4, the first portion 142 the second portion 144 may be integral and continuous with each other, e.g., to define a single and seamless structure, to define the first gate electrode 140 with a longitudinal direction extending along the second Y direction. For example, as further shown in FIG. 4, the first portion 142 and the second portion 144 may have coplanar bottom surfaces extending along the second Y direction, while top surfaces thereof extend to different heights along a third direction Z. For example, as shown in FIG. 4, the height of a top surface 144U of the second portion 144 may be higher than the height of a top surface 142U of the first portion 142, e.g., along the third direction Z relative to a top surface of the substrate 100. Also, e.g., an upper portion of the second portion 144 may include a sidewall 144S. The sidewall 144S of the second portion 144 may connect the top surface 142U of the first portion 142 to the top surface 144U of the second portion 144, e.g., the sidewall 144S may extend along the third direction Z to connect the top surface 142U and the top surface 144U to each other along an entirety of a width of first gate electrode 140 in the first direction X.

In some embodiments, the first portion 142 and the second portion 144 may be arranged along the second direction Y, e.g., the first portion 142 and the second portion 144 may be adjacent to each other along the second direction Y. For example, the sidewall 144S of the second portion 144 may extend in the first direction X. In some embodiments, the first portion 142 may be formed on the first active pattern 122, and the second portion 144 may be formed on the second active pattern 124.

The first gate electrode 140 may include a conductive material. For example, the first gate electrode 140 may include a metal layer. For example, the first gate electrode 140 may include at least one of Ti, Ta, W, Al, Co and a combination thereof. However, embodiments are not limited thereto, and the first gate electrode 140 may include silicon or silicon germanium instead of metal.

Although the first gate electrode 140 is shown as a single film, embodiments are not limited thereto. For example, the first gate electrode 140 may be formed by stacking a plurality of conductive materials. For example, the first gate electrode 140 may include a work function adjusting film to adjust the work function and a filling conductive film to fill a space formed by the work function adjusting film. The work function adjusting film may include at least one of, e.g., TiN, TaN, TiC, TaC, TiAlC and a combination thereof. The filling conductive film may include, e.g., W or Al. The first gate electrode 140 may be formed, e.g., by a replacement process. However, embodiments are not limited thereto.

The gate dielectric layer 130 may be interposed between the substrate 100 and the first gate electrode 140. For example, the gate dielectric layer 130 may extend along the sidewalls and bottom surface of the first gate electrode 140. However, embodiments are not limited thereto, and the gate dielectric layer 130 may extend only along the bottom surface of the first gate electrode 140. In addition, the gate dielectric layer 130 may be interposed between the field insulating layer 110 and the first gate electrode 140. For example, the gate dielectric layer 130 may extend further along the top surface of the field insulating layer 110.

The gate dielectric layer 130 may include at least one of, e.g., silicon oxide, silicon oxynitride, silicon nitride, and a high-k material having a higher dielectric constant than that of silicon oxide. The high-k material may include, e.g., hafnium oxide, but it is not limited thereto.

The semiconductor device according to some embodiments may further include a first interface layer 125 and a second interface layer 127. The first interface layer 125 may be interposed between the first active pattern 122 and the gate dielectric layer 130, and the second interface layer 127 may be interposed between the second active pattern 124 and the gate dielectric layer 130. For example, as shown in FIG. 4, the first interface layer 125 and the second interface layer 127 may extend along the outer surface of the first active pattern 122 and the outer surface of the second active pattern 124 exposed by the field insulating layer 110.

Although it is illustrated in FIGS. 2 and 3 that the first interface layer 125 and the second interface layer 127 are formed only on the top surface of the first active pattern 122 and the top surface of the second active pattern 124, respectively, embodiments are not limited thereto. In some embodiments, the first interface layer 125 and the second interface layer 127 may extend further along the sidewalls of the first gate electrode 140.

The gate spacers 152 may be formed on the substrate 100 and the field insulating layer 110. In addition, the gate spacers 152 may extend along both sidewalls of the first gate electrode 140. Thus, the gate spacers 152 may intersect the first active pattern 122 and the second active pattern 124. For example, the gate spacers 152 may be elongated in the second direction Y. The gate spacers 152 may include, e.g., at least one of silicon oxide, silicon nitride, silicon oxynitride and a combination thereof. However, embodiments are not limited thereto.

The gate capping pattern 154 may cover the top surface of the first gate electrode 140. For example, the gate capping pattern 154 may extend along the top surface of the first gate electrode 140. For example, the gate capping pattern 154 may be elongated in the second direction Y.

In some embodiments, the gate capping pattern 154 may be formed on the first gate electrode 140, the gate dielectric layer 130, and the gate spacers 152. For example, as shown in FIGS. 2 and 3, the gate capping pattern 154 may cover the top surface of the first gate electrode 140, the topmost surface of the gate dielectric layer 130, and the top surface of the gate spacers 152.

In some embodiments, the bottom surface of the gate capping pattern 154 on the first portion 142 may be lower than the bottom surface of the gate capping pattern 154 on the second portion 144. For example, as illustrated in FIG. 4, a top surface of the gate capping pattern 154 may be substantially flat and parallel to a top surface of the substrate 100, while a bottom surface of the gate capping pattern 154 facing the first gate electrode 140 may be complementary with respect to the top surfaces 142U,144U of the first and second portions 142 and 144 of the first gate electrode 140. In some embodiments, however, the top surface of the gate capping pattern 154 on the first portion 142 may be disposed on the same plane with the top surface of the gate capping pattern 154 on the second portion 144. The term "same" used herein not only means being completely identical but also includes a minute difference that may occur due to a process margin and the like. Accordingly, a thickness T11 of the gate capping pattern 154 on the first portion 142 may be greater than a thickness T12 of the gate capping pattern 154 on the second portion 144, e.g., along the third direction Z.

The first source/drain region 162 may be formed in the first active pattern 122 on the sidewalls of the first gate electrode 140. However, the first source/drain region 162 may be insulated from the first gate electrode 140. For example, the first source/drain region 162 may be spaced apart from the first gate electrode 140 by the gate spacers 152. The first source/drain region 162 may serve as the source/drain of the transistor including the first active pattern 122 and the first gate electrode 140.

The second source/drain region 164 may be formed in the second active pattern 124 on the sidewalls of the first gate electrode 140. However, the second source/drain region 164 may be insulated from the first gate electrode 140. For example, the second source/drain region 164 may be spaced apart from the first gate electrode 140 by the gate spacers 152. The second source/drain region 164 may serve as the source/drain of the transistor including the second active pattern 124 and the first gate electrode 140.

The first source/drain region 162 and the second source/drain region 164 may include an epitaxial layer formed in the first active pattern 122 and the second active pattern 124, respectively. Further, the first source/drain region 162 and the second source/drain region 164 may be an elevated source/drain region including a top surface protruding upwardly from the top surface of the substrate 100. However, embodiments are not limited thereto, and the first source/drain region 162 and the second source/drain region 164 may be an impurity region formed in the substrate 100.

In a case where the semiconductor device according to some embodiments is a PMOS transistor, the first source/drain region 162 and the second source/drain region 164 may include p-type impurities or impurities for preventing the diffusion of p-type impurities. For example, the first source/drain region 162 and the second source/drain region 164 may include, e.g., at least one of B, C, In, Ga, Al and a combination thereof.

In addition, when the semiconductor device according to some embodiments is a PMOS transistor, the first source/drain region 162 and the second source/drain region 164 may include a compressive stress material. For example, when the first active pattern 122 is Si, the first source/drain region 162 may include a material, e.g., SiGe, having a larger lattice constant than Si. The compressive stress material may apply compressive stress to the first active pattern 122 to improve the mobility of carriers in the channel region.

Alternatively, when the semiconductor device according to some embodiments is an NMOS transistor, the first source/drain region 162 and the second source/drain region 164 may include n-type impurities or impurities for preventing the diffusion of n-type impurities. For example, the first source/drain region 162 and the second source/drain region 164 may include, e.g., at least one of P, Sb, As and a combination thereof.

In addition, when the semiconductor device according to some embodiments is an NMOS transistor, the first source/drain region 162 and the second source/drain region 164 may include a tensile stress material. For example, when the first active pattern 122 is Si, the first source/drain region 162 may include a material, e.g., SiC, having a smaller lattice constant than Si. The tensile stress material may apply tensile stress to the first active pattern 122 to improve the mobility of carriers in the channel region.

Although each of the first source/drain region 162 and the second source/drain region 164 is shown as a single film, embodiments are not limited thereto. For example, each of the first source/drain region 162 and the second source/drain region 164 may be formed of multiple films containing different concentrations of impurities.

Figure 11:
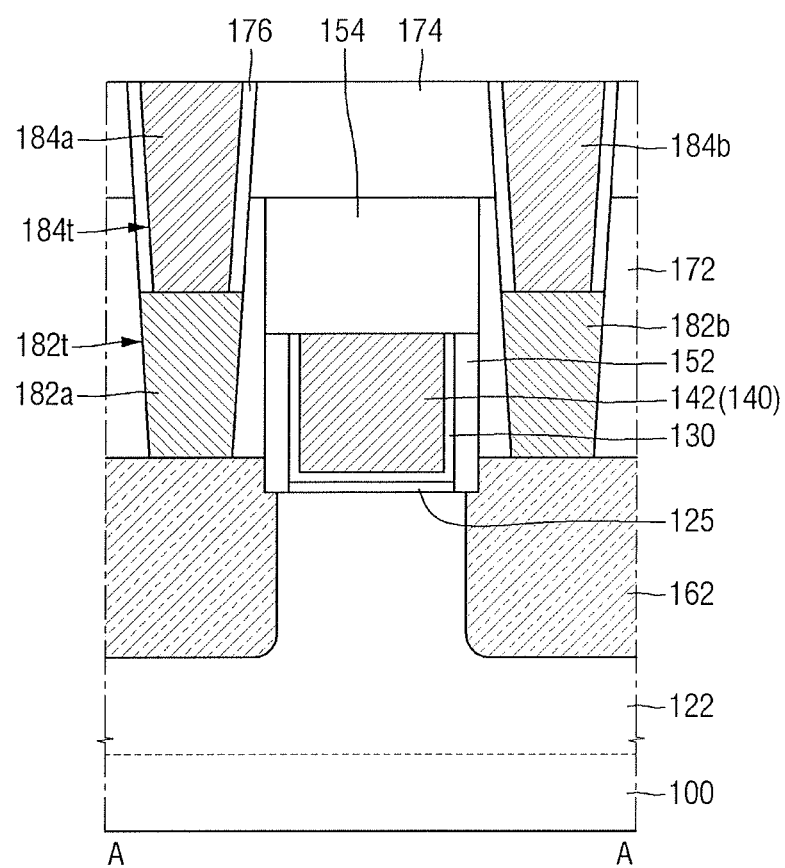
FIGS. 11 and 12 illustrate cross-sectional views of a semiconductor device according to some embodiments.
Figure 26:
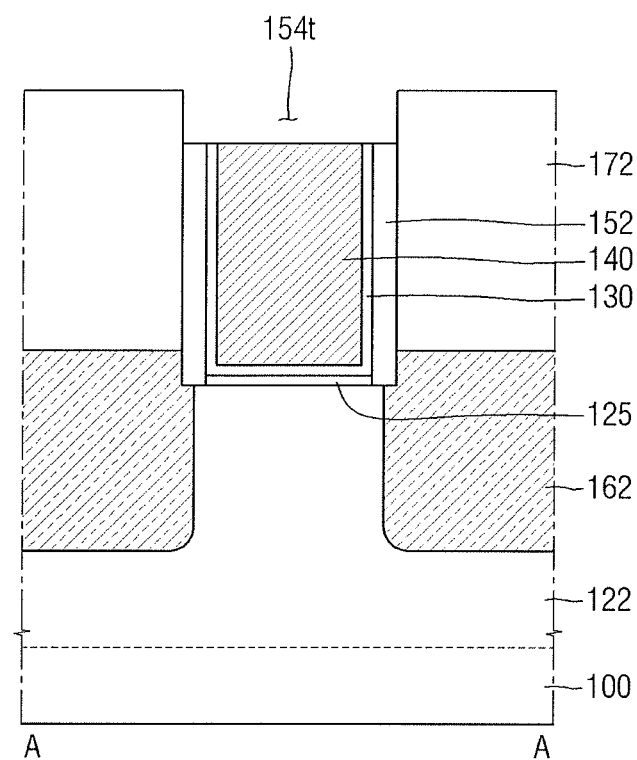
FIGS. 26 to 40 illustrate diagrams of stages in a method for fabricating a semiconductor device according to some embodiments.

The first interlayer insulating film 172 and the second interlayer insulating film 174 may be sequentially stacked on the substrate 100 (e.g., FIGS. 11 and 26). Although not shown in detail, the first interlayer insulating film 172 and the second interlayer insulating film 174 may cover the field insulating layer 110, the first source/drain region 162, the second source/drain region 164, the gate spacers 152, and the gate capping pattern 154. For example, the first interlayer insulating film 172 may cover the top surface of the field insulating layer 110, the top surface of the first source/drain region 162, the top surface of the second source/drain region 164, and the sidewalls of the gate spacers 152. Further, e.g., the second interlayer insulating film 174 may cover the top surface of the gate capping pattern 154 and the top surface of the first interlayer insulating film 172. The first interlayer insulating film 172 and the second interlayer insulating film 174 may include at least one of, e.g., silicon oxide, silicon nitride, silicon oxynitride and a low-k material having a lower dielectric constant than that of silicon oxide.

The first source/drain contact 182a and the second source/drain contact 182b may be formed on the first source/drain region 162. For example, the first source/drain contact 182a may be formed on the first source/drain region 162 on one sidewall of the first gate electrode 140, and the second source/drain contact 182b may be formed on the second source/drain region 164 on the other sidewall of the first gate electrode 140.

The first source/drain contact 182a and the second source/drain contact 182b may be connected to the first source/drain region 162. For example, as shown in FIG. 2, a first contact hole 182t may be defined and formed through the first interlayer insulating film 172 and the second interlayer insulating film 174 to expose the first source/drain region 162. In some embodiments, the sidewall of the first contact hole 182t may be defined by the sidewall of the gate spacer 152, the sidewall of the gate capping pattern 154, and the sidewall of the second interlayer insulating film 174. The first source/drain contact 182a and the second source/drain contact 182b may be formed to fill a portion of the first contact hole 182t. Accordingly, the first source/drain contact 182a and the second source/drain contact 182b may be formed to be connected to the top surface of the first source/drain region 162.

The first source/drain contact 182a and the second source/drain contact 182b may include a conductive material. For example, the first source/drain contact 182a and the second source/drain contact 182b may include a metal layer. For example, the first source/drain contact 182a and the second source/drain contact 182b may include at least one of Ti, Ta, W, Al, Co and a combination thereof, e.g., the first source/drain contact 182a and the second source/drain contact 182b may include Co. However, embodiments are not limited thereto.

In some embodiments, the top surface of the first source/drain contact 182a and the top surface of the second source/drain contact 182b may be higher than the top surface 142U of the first portion 142, and may be lower than the top surface 144U of the second portion 144. For example, as shown in FIGS. 2 and 5, the height of the top surface of the first source/drain contact 182a may be higher by D11 than the height of the top surface 142U of the first portion 142. Further, as shown in FIGS. 3 and 5, the height of the top surface of the first source/drain contact 182a may be lower by D12 than the height of the top surface 144U of the second portion 144. Accordingly, as shown in FIGS. 4 and 5, a difference in height between the top surface 142U of the first portion 142 and the top surface 144U of the second portion 144 may be D11+D12.

In some embodiments, the first source/drain contact 182a and the second source/drain contact 182b may connect the first source/drain region 162 to the second source/drain region 164. For example, as shown in FIG. 1, the first source/drain contact 182a and the second source/drain contact 182b may extend in the second direction Y to overlap both the first active pattern 122 and the second active pattern 124. Accordingly, as shown in FIGS. 2 and 3, the first source/drain contact 182a may be connected to both the first source/drain region 162 and the second source/drain region 164 on one sidewall of the first gate electrode 140. Further, the second source/drain contact 182b may be connected to both the first source/drain region 162 and the second source/drain region 164 on the other sidewall of the first gate electrode 140.

In some embodiments, the sidewall of the first source/drain contact 182a and the sidewall of the second source/drain contact 182b may be defined by the sidewalls of the gate spacers 152 and/or the sidewalls of the gate capping pattern 154. For example, the first source/drain contact 182a and the second source/drain contact 182b may be formed by a self-aligned contact (SAC) process. For example, the gate spacers 152 and/or the gate capping pattern 154 may include a material having an etch selectivity with respect to the first interlayer insulating film 172 and the second interlayer insulating film 174.

The first contact plug 192 may be formed on the second portion 144 of the first gate electrode 140. The first contact plug 192 may be connected to the second portion 144 of the first gate electrode 140. For example, as shown in FIG. 3, a second contact hole 192t may be defined and formed through the gate capping pattern 154 and the second interlayer insulating film 174 to expose the second portion 144 of the first gate electrode 140. The first contact plug 192 may be formed to fill the second contact hole 192t. Accordingly, the first contact plug 192 may be formed to be connected to the top surface 144U of the second portion 144 of the first gate electrode 140.

In some embodiments, the bottom surface of the first contact plug 192 may be higher than the top surface of the first source/drain contact 182a and the top surface of the second source/drain contact 182b. For example, as shown in FIGS. 3 and 4, the height of the bottom surface of the first contact plug 192 may be higher by D12 than the height of the top surface of the first source/drain contact 182a.

In some embodiments, the first contact plug 192 may not be formed by a self-aligned contact (SAC) process. For example, the sidewall of the first contact plug 192 may not be defined by the sidewall of the filling insulating film 176. For example, the first contact plug 192 may be spaced apart from a filling insulating film 176 by the second interlayer insulating film 174.

In some embodiments, the first contact plug 192 may be formed on the first active region ACTIVE1 of the substrate 100. For example, the first contact plug 192 may overlap the second active pattern 124. The term "overlapping" as used herein means overlapping in a direction perpendicular to the top surface of the substrate 100.

In some embodiments, the width of the first contact plug 192 may increase as it goes away from the top surface of the substrate 100. This can be attributed to, e.g., the characteristics of an etching process for forming the second contact hole 192t.

The second contact plug 184a may be formed on the first source/drain contact 182a and the third contact plug 184b may be formed on the second source/drain contact 182b. The second contact plug 184a may be connected to the first source/drain contact 182a and the third contact plug 184b may be connected to the second source/drain contact 182b.

For example, as shown in FIG. 2, the filling insulating film 176 filling the other portion of the first contact hole 182t may be formed on the first source/drain contact 182a. Further, a third contact hole 184t may be defined to expose the first source/drain contact 182a through the filling insulating film 176. The second contact plug 184a may be formed to fill the third contact hole 184t. Accordingly, the second contact plug 184a may be formed to be connected to the top surface of the first source/drain contact 182a. Similarly, the third contact plug 184b may be formed to be connected to the top surface of the second source/drain contact 182b.

In some embodiments, the bottom surface of the second contact plug 184a and the bottom surface of the third contact plug 184b may be higher than the top surface 142U of the first portion 142 of the first gate electrode 140. For example, as shown in FIGS. 2 and 5, the height of the bottom surface of the second contact plug 184a may be higher by D11 than the height of the top surface 142U of the first portion 142 of the first gate electrode 140.

In some embodiments, the second contact plug 184a and the third contact plug 184b may be adjacent to the first portion 142 of the first gate electrode 140. For example, each of the second contact plug 184a and the third contact plug 184b may be arranged along the first direction X with the first portion 142 of the first gate electrode 140.

Although it is illustrated in FIG. 1 that the second contact plug 184a, the first portion 142, and the third contact plug 184b are sequentially arranged along the first direction X, embodiments are not limited thereto. For example, the second contact plug 184a and the third contact plug 184b may be arranged along another direction intersecting the first direction X.

In some embodiments, the second contact plug 184a and the third contact plug 184b may not be formed by a self-aligned contact (SAC) process. For example, the sidewall of the second contact plug 184a and the sidewall of the third contact plug 184b may not be defined by the sidewalls of the gate spacers 152 and/or the sidewalls of the gate capping pattern 154. In some embodiments, the second contact plug 184a and the third contact plug 184b may be spaced apart from the gate spacers 152 and/or the gate capping pattern 154 by the filling insulating film 176.

In some embodiments, the width of the second contact plug 184a and the width of the third contact plug 184b may increase as they go away from the top surface of the substrate 100. This can be attributed to, e.g., the characteristics of an etching process for forming the third contact hole 184t. However, embodiments are not limited thereto.

In some embodiments, the first contact plug 192, the second contact plug 184a, and the third contact plug 184b may be formed at the same level. The term "the same level" as used herein means being formed by the same manufacturing process.

A self-aligned contact (SAC) process has been used to form a fine pitch contact. However, as a semiconductor device becomes more highly integrated, a short circuit may occur between the gate electrode and the source/drain region due to insufficient difference in selectivity between films when forming a contact hole in a self-aligned contact process, which is problematic. For example, in the formation of a contact hole for forming a source/drain contact plug using a self-aligned contact process, a short circuit may occur between the gate electrode and the source/drain contact plug. On the other hand, in the formation of a contact hole for forming a gate contact plug using a self-aligned contact process, a short circuit may occur between the source/drain contact and the gate contact plug.

In contrast, according to exemplary embodiments, the semiconductor device according to some embodiments can prevent a short circuit from occurring between the gate electrode and the source/drain region by using the first gate electrode 140, the top surface of which has a height difference. That is, the bottom surface of the first contact plug 192 formed on the second portion 144 of the first gate electrode 140 may be formed to be higher than the top surface of the first source/drain contact 182a. Thus, a short circuit can be prevented by ensuring a distance between the first contact plug 192 and the first source/drain region 162. Further, e.g., the bottom surface of the second contact plug 184a formed on the first source/drain contact 182a may be formed on the top surface 142U of the first portion 142 of the first gate electrode 140. Thus, a short circuit can be prevented by ensuring a distance between the second contact plug 184a and the first gate electrode 140. Therefore, a semiconductor device with improved product reliability and process margin can be provided.

Figure 6:
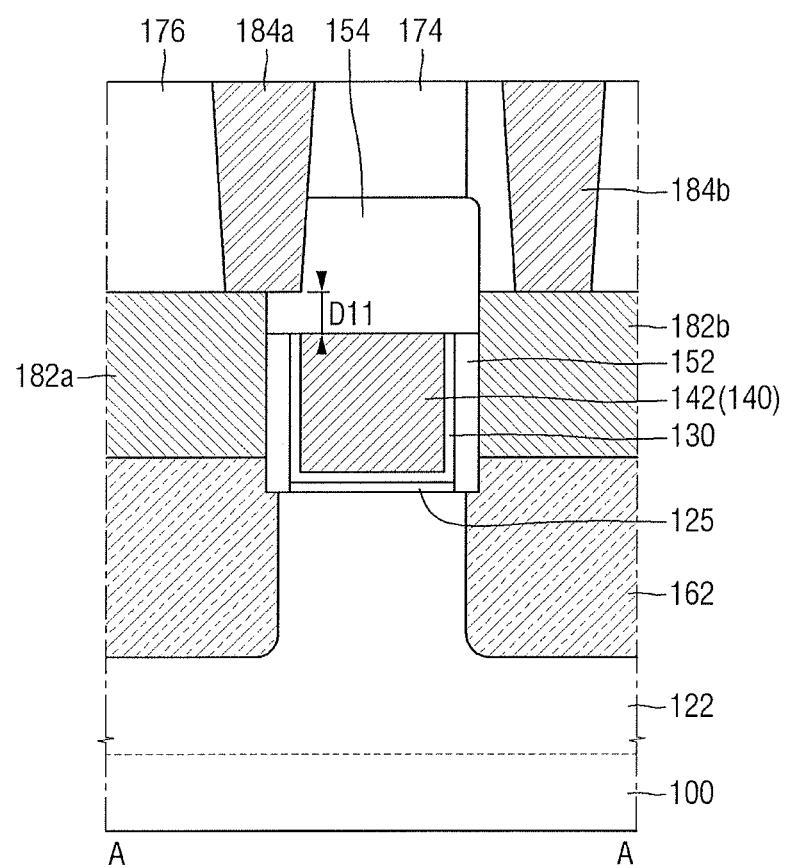
FIG. 6 illustrates a cross-sectional view of a semiconductor device according to some embodiments.

FIG. 6 is a cross-sectional view illustrating a semiconductor device according to some embodiments. For simplicity of description, a description overlapping with the description with reference to FIGS. 1 to 5 will be only briefly given or omitted.

Referring to FIG. 6, in a semiconductor device according to some embodiments, at least a portion of the second contact plug 184*a* overlaps the first portion 142 of the first gate electrode 140. For example, in a process of forming the second contact plug 184*a*, misalignment may occur with respect to the second contact plug 184*a*. In this case, the second contact plug 184*a* may be formed closer to the first gate electrode 140 than intended.

However, the second contact plug 184*a* may be connected to the top surface of the first source/drain contact 182*a*. Accordingly, the bottom surface of the second contact plug 184*a* may be higher than the top surface 142U of the first portion 142 of the first gate electrode 140. For example, the height of the bottom surface of the second contact plug 184*a* may be higher by D11 than the height of the top surface 142U of the first portion 142 of the first gate electrode 140.

That is, even if misalignment occurs with respect to the second contact plug 184*a*, the semiconductor device according to some embodiments can secure a certain distance (for example, D11) for separating the second contact plug 184*a* and the first gate electrode 140 from each other. Thus, a semiconductor device with improved product reliability and process margin can be provided.

Although it is illustrated in FIG. 6 that only the second contact plug 184*a* overlaps the first portion 142, this is merely for simplicity of illustration, and embodiments are not limited thereto. For example, both the second contact plug 184*a* and the third contact plug 184*b* may overlap the first portion 142.

Figure 7:
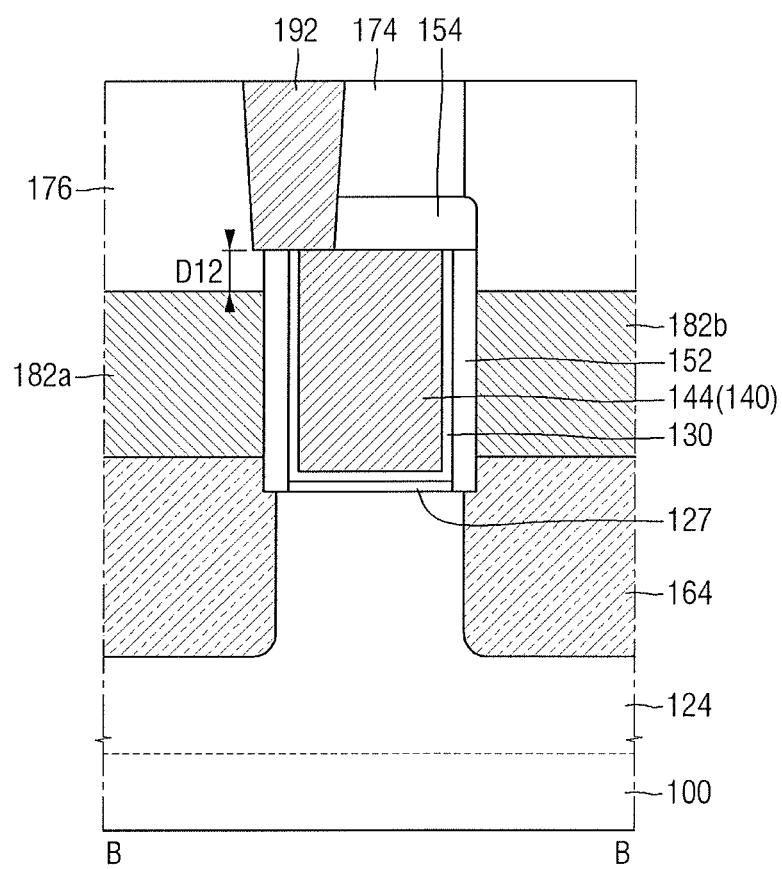
FIG. 7 illustrates a cross-sectional view of a semiconductor device according to some embodiments.

FIG. 7 is a cross-sectional view illustrating a semiconductor device according to some embodiments. For simplicity of description, a description overlapping with the description with reference to FIGS. 1 to 5 will be only briefly given or omitted.

Referring to FIG. 7, in a semiconductor device according to some embodiments, at least a portion of the first contact plug 192 overlaps the first source/drain contact 182*a*. For example, in a process of forming the first contact plug 192, misalignment may occur with respect to the first contact plug 192. In this case, the first contact plug 192 may be formed closer to the first source/drain contact 182*a* than intended.

However, the first contact plug 192 may be connected to the top surface 144U of the second portion 144 of the first gate electrode 140. Accordingly, the bottom surface of the first contact plug 192 may be higher than the top surface of the first source/drain contact 182*a*. For example, the height of the bottom surface of the first contact plug 192 may be higher by D12 than the height of the top surface of the first source/drain contact 182*a*.

That is, even if misalignment occurs with respect to the first contact plug 192, the semiconductor device according to some embodiments can secure a certain distance (for example, D12) for separating the first contact plug 192 and the first source/drain contact 182*a* from each other. Thus, a semiconductor device with improved product reliability and process margin can be provided.

Figure 8:
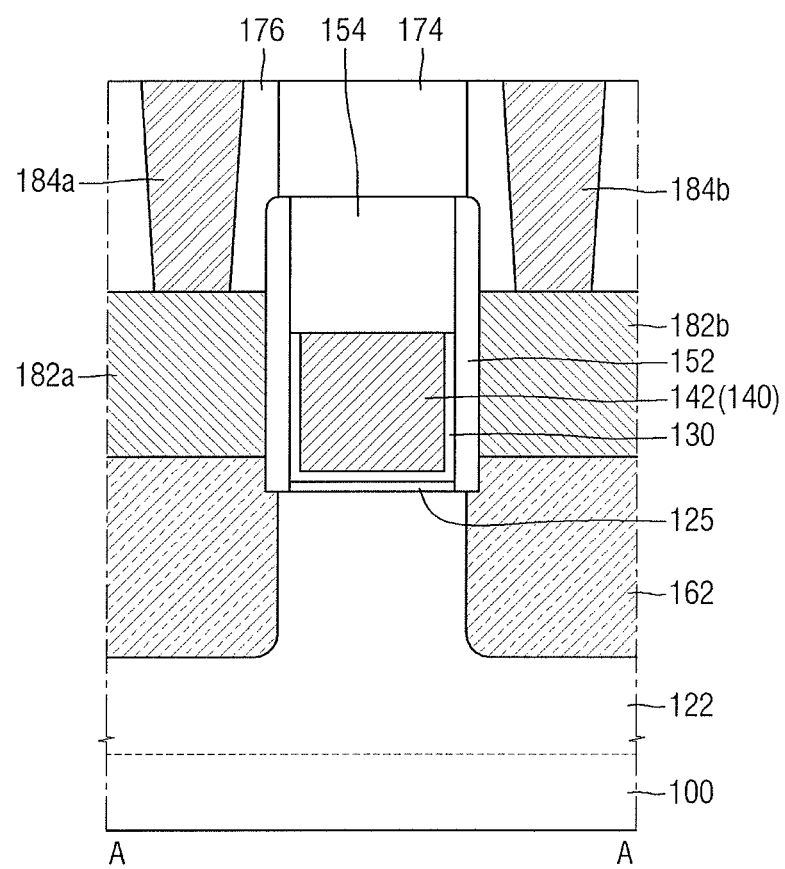
FIGS. 8 and 9 illustrate cross-sectional views of a semiconductor device according to some embodiments.
Figure 9:
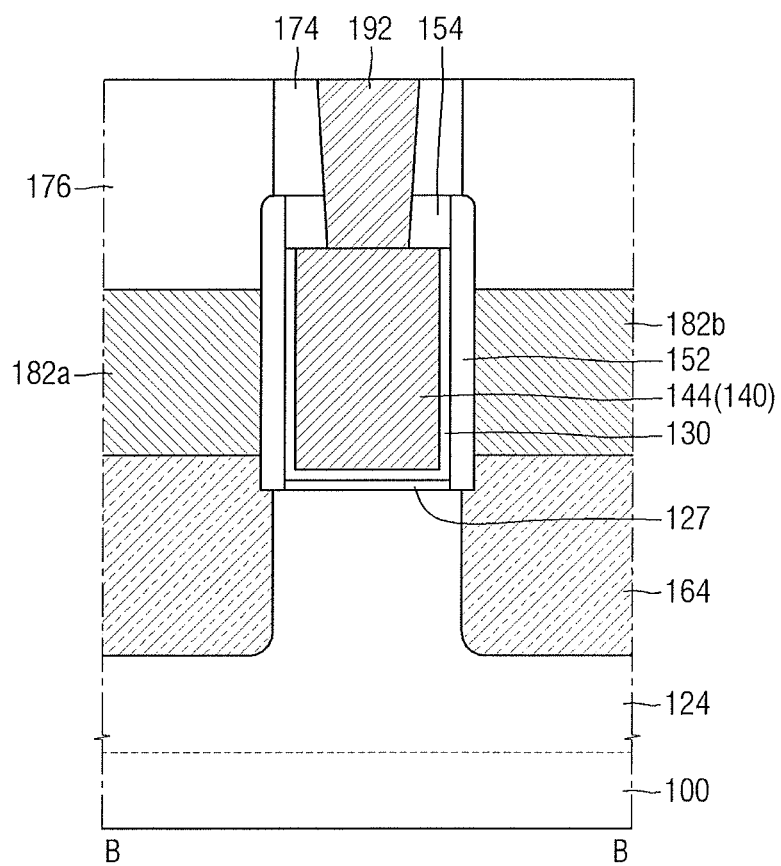

FIGS. 8 and 9 are cross-sectional views illustrating a semiconductor device according to some embodiments. For reference, FIG. 8 is a cross-sectional view taken along line A-A of FIG. 1, and FIG. 9 is a cross-sectional view taken along line B-B of FIG. 1. For simplicity of description, a description overlapping with the description with reference to FIGS. 1 to 5 will be only briefly given or omitted.

Referring to FIGS. 8 and 9, in a semiconductor device according to some embodiments, the gate spacers 152 extend further along the sidewalls of the gate capping pattern 154. For example, the gate spacers 152 may define a gate trench on the substrate 100. For example, the sidewalls of the gate trench may be defined by inner sidewalls of the gate spacers 152. In this case, the first gate electrode 140 may fill a lower portion of the gate trench, and the gate capping pattern 154 may fill an upper portion of the gate trench.

Figure 10:
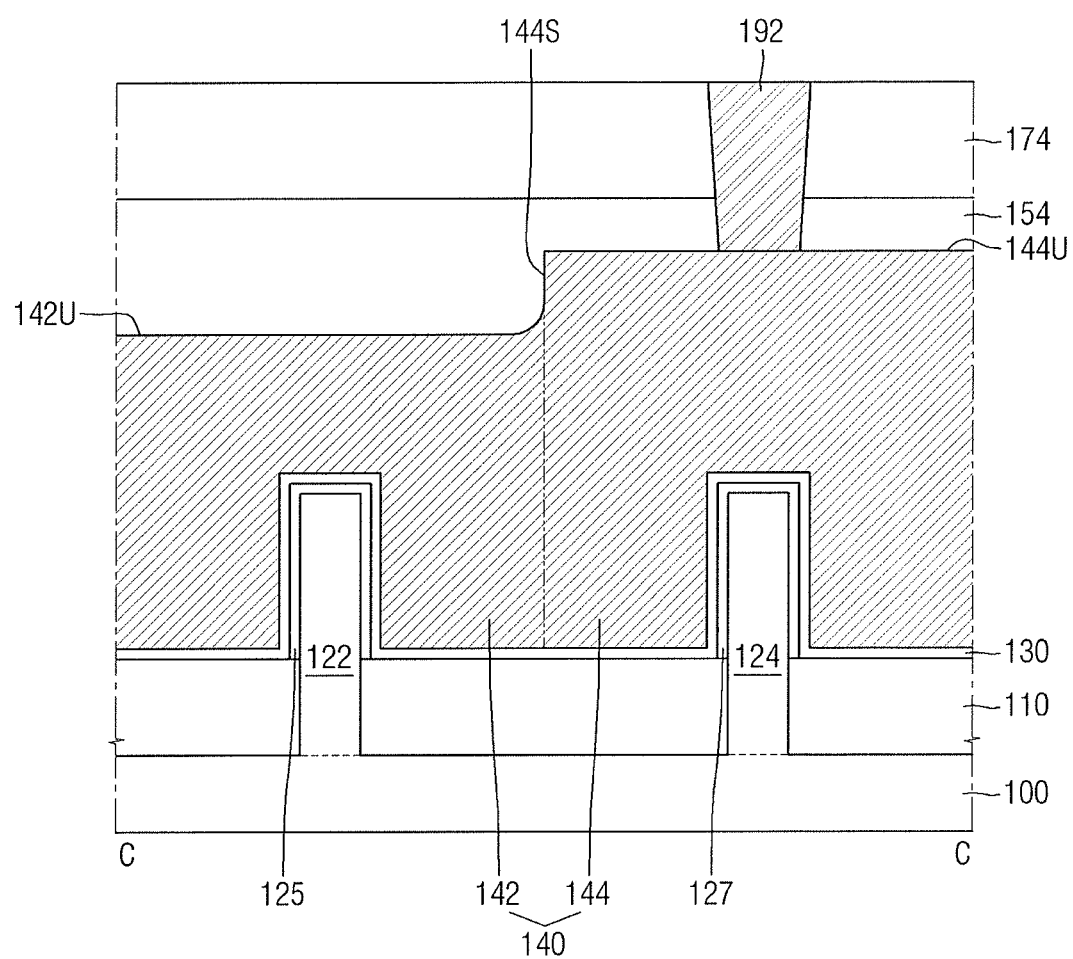
FIG. 10 illustrates a cross-sectional view of a semiconductor device according to some embodiments.

FIG. 10 is a cross-sectional view illustrating a semiconductor device according to some embodiments. For reference, FIG. 10 is a cross-sectional view taken along line C-C of FIG. 1. For simplicity of description, a description overlapping with the description with reference to FIGS. 1 to 5 will be only briefly given or omitted.

Referring to FIG. 10, in a semiconductor device according to some embodiments, the top surface 142U of the first portion 142 adjacent to the second portion 144 has an upwardly concave shape. For example, the height of the top surface of the first portion 142 adjacent to the second portion 144 may increase as it approaches the second portion 144. As illustrated, in some embodiments, the slope of the top surface of the first portion 142 may be continuous with the slope of the sidewall 144S of the second portion 144. This can be attributed to, e.g., the characteristics of a recess process for forming the first portion 142 of the first gate electrode 140.

Figure 12:
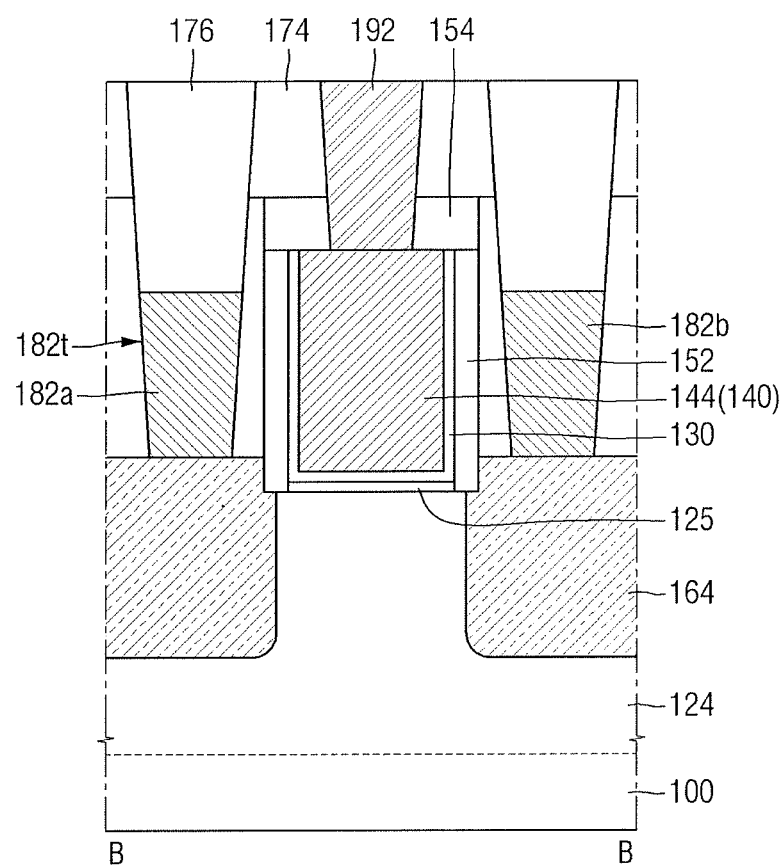

FIGS. 11 and 12 are cross-sectional views illustrating a semiconductor device according to some embodiments. For reference, FIG. 11 is a cross-sectional view taken along line A-A of FIG. 1, and FIG. 12 is a cross-sectional view taken along line B-B of FIG. 1. For simplicity of description, a description overlapping with the description with reference to FIGS. 1 to 5 will be only briefly given or omitted.

Referring to FIGS. 11 and 12, in a semiconductor device according to some embodiments, the first source/drain contact 182*a* and the second source/drain contact 182*b* are not formed by a self-aligned contact (SAC) process. For example, the sidewalls of the first source/drain contact 182*a* and the sidewalls of the second source/drain contact 182*b* may not be defined on the sidewalls of the gate spacers 152 and/or the sidewalls of the gate capping pattern 154. In some embodiments, the first source/drain contact 182*a* and the second source/drain contact 182*b* may be separated from the gate spacers 152 and/or the gate capping pattern 154 by the first interlayer insulating film 172.

In some embodiments, the width of the first source/drain contact 182*a* and the width of the second source/drain contact 182*b* may increase as they go away from the top surface of the substrate 100. This can be attributed to the characteristics of an etching process for forming the first contact hole 182*t*, but embodiments are not limited thereto.

Figure 13:
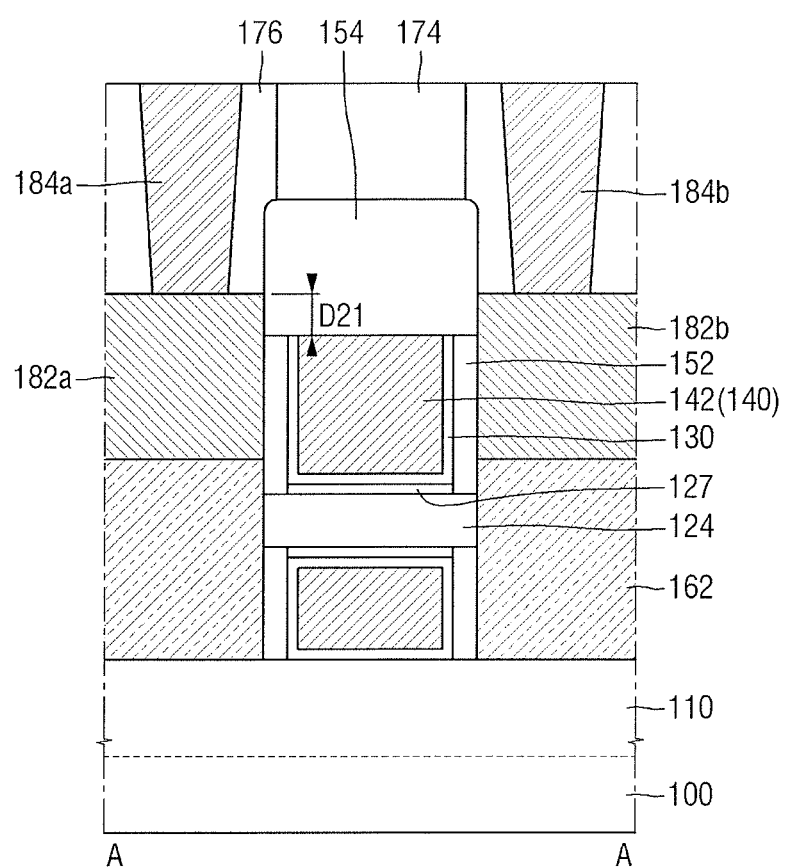
FIGS. 13 to 15 illustrate cross-sectional views of a semiconductor device according to some embodiments.
Figure 14:
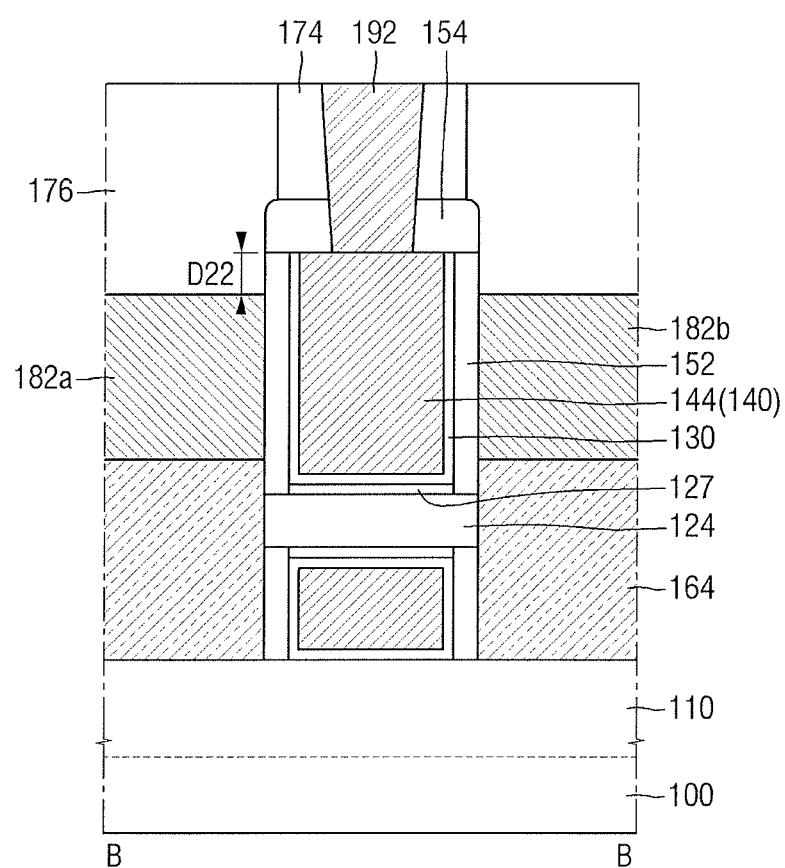
Figure 15:
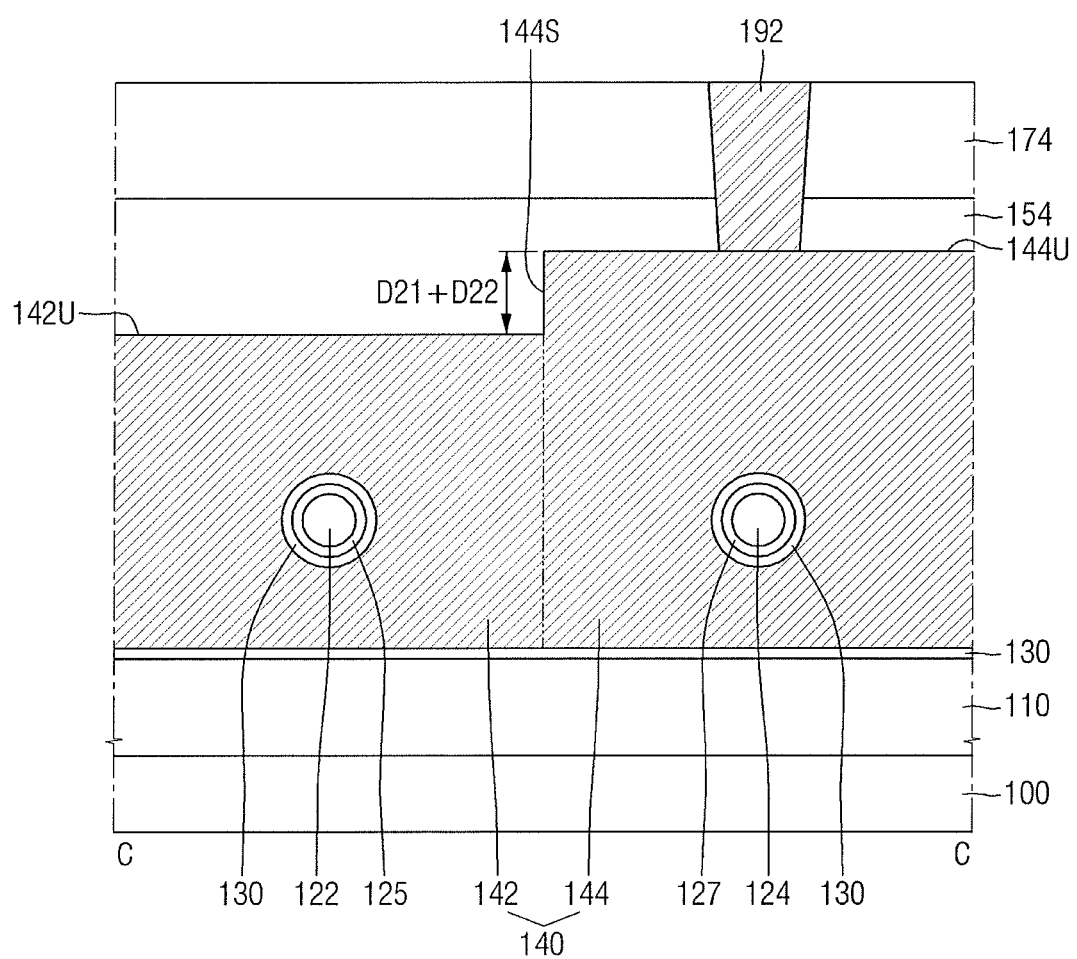

FIGS. 13 to 15 are cross-sectional views illustrating a semiconductor device according to some embodiments. For reference, FIG. 13 is a cross-sectional view taken along line A-A of FIG. 1, FIG. 14 is a cross-sectional view taken along line B-B of FIG. 1, and FIG. 15 is a cross-sectional view taken along line C-C of FIG. 1. For simplicity of description, a description overlapping with the description with reference to FIGS. 1 to 5 will be only briefly given or omitted.

Referring to FIGS. 13 to 15, in a semiconductor device according to some embodiments, each of the first active pattern 122 and the second active pattern 124 includes a wire pattern. For example, the first active pattern 122 and the second active pattern 124 may be elongated in the first direction X so as to be spaced apart from the substrate 100. In addition, the first active pattern 122 and the second active pattern 124 may pass through the first gate electrode 140. Thus, as shown in FIG. 15, the first gate electrode 140 may surround the outer surface of the first active pattern 122 and the outer surface of the second active pattern 124.

In some embodiments, the top surface of the first source/drain contact 182a and the top surface of the second source/drain contact 182b may be higher than the top surface 142U of the first portion 142, and may be lower than the top surface 144U of the second portion 144. For example, the height of the top surface of the first source/drain contact 182a may be higher by D21 than the height of the top surface 142U of the first portion 142. Further, the height of the top surface of the first source/drain contact 182a may be lower by D22 than the height of the top surface 144U of the second portion 144. Accordingly, a difference in height between the top surface 142U of the first portion 142 and the top surface 144U of the second portion 144 may be D21+D22.

Although it is illustrated in FIG. 15 that the cross section of the first active pattern 122 and the cross section of the second active pattern 124 are circular, this is merely exemplary, and embodiments are not limited thereto. For example, the cross section of the first active pattern 122 and the cross section of the second active pattern 124 may be polygonal (e.g., rectangular).

Figure 16:
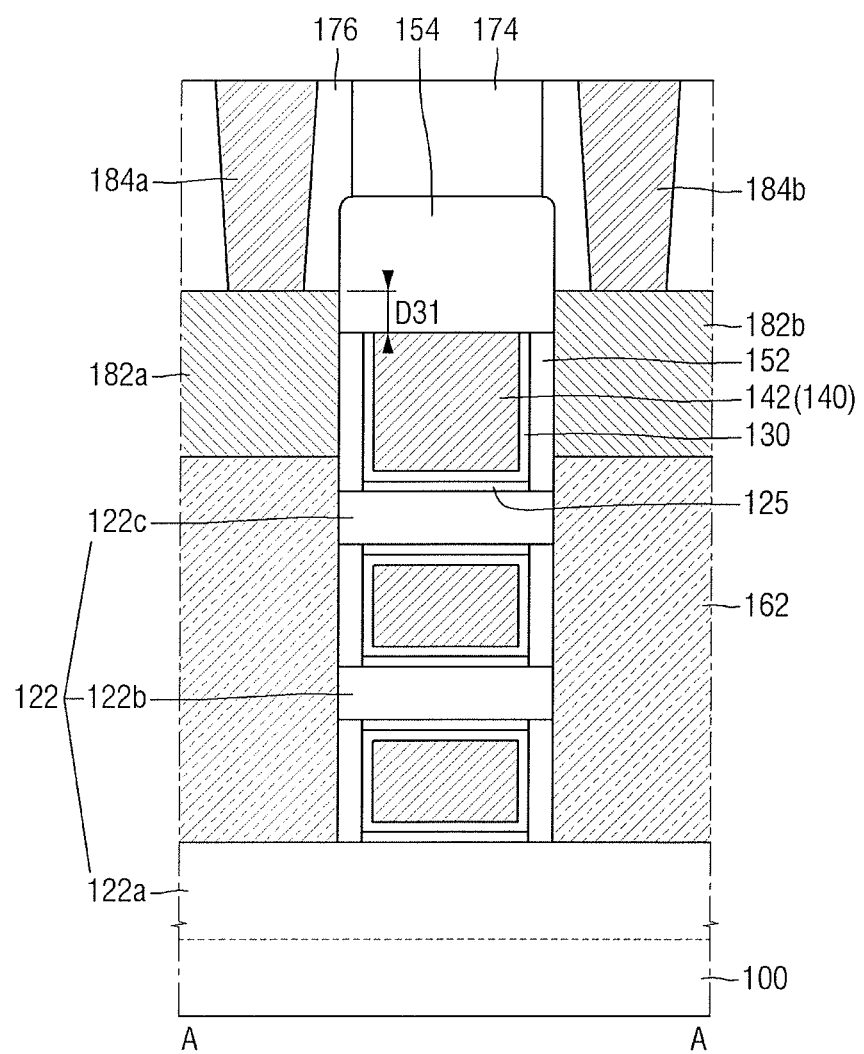
FIGS. 16 to 18 illustrate cross-sectional views of a semiconductor device according to some embodiments.
Figure 17:
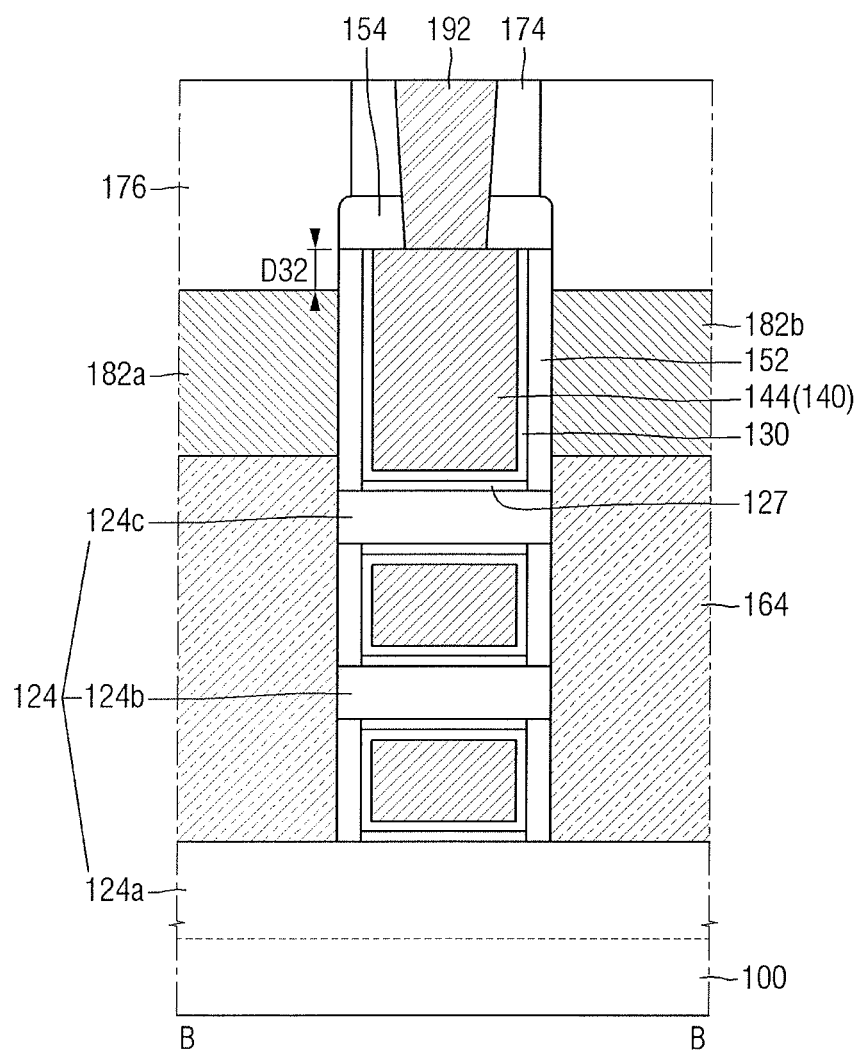
Figure 18:
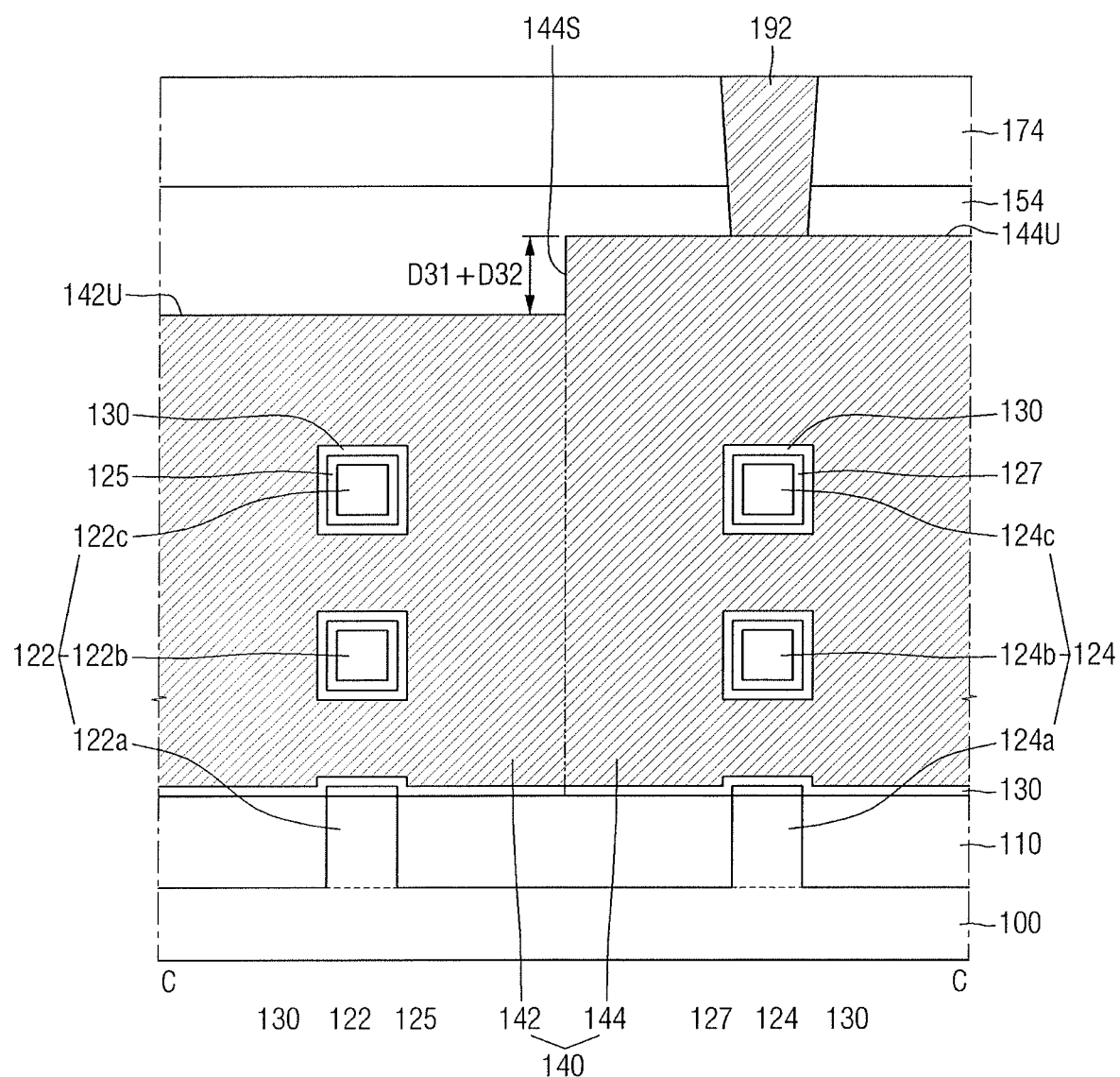

FIGS. 16 to 18 are cross-sectional views illustrating a semiconductor device according to some embodiments. For reference, FIG. 16 is a cross-sectional view taken along line A-A of FIG. 1, FIG. 17 is a cross-sectional view taken along line B-B of FIG. 1, and FIG. 18 is a cross-sectional view taken along line C-C of FIG. 1. For simplicity of description, a description overlapping with the description with reference to FIGS. 1 to 5 will be briefly given or omitted.

Referring to FIGS. 16 to 18, in a semiconductor device according to some embodiments, each of the first active pattern 122 and the second active pattern 124 includes a plurality of channel patterns. For example, the first active pattern 122 may include first to third channel patterns 122a, 122b and 122c which are spaced from each other, and the second active pattern 124 may include a plurality of fourth to sixth channel patterns 124a, 124b and 124c which are spaced from each other. The first channel pattern 122a and the fourth channel pattern 124a may protrude from the top surface of the substrate 100 and may be elongated in the first direction X.

The second channel pattern 122b and the third channel pattern 122c may be sequentially disposed on the first channel pattern 122a. Each of the second channel pattern 122b and the third channel pattern 122c may be spaced apart from the substrate 100 and may be elongated in the first direction X. Accordingly, as shown in FIG. 18, the first gate electrode 140 may surround the outer surface of the first channel pattern 122a and the outer surface of the second channel pattern 122b.

The fifth channel pattern 124b and the sixth channel pattern 124c may be sequentially disposed on the second channel pattern 122b. Each of the fifth channel pattern 124b and the sixth channel pattern 124c may be spaced apart from the substrate 100 and may be elongated in the first direction X. Accordingly, as shown in FIG. 18, the first gate electrode 140 may surround the outer surface of the fifth channel pattern 124b and the outer surface of the sixth channel pattern 124c.

In some embodiments, the top surface of the first source/drain contact 182a and the top surface of the second source/drain contact 182b may be higher than the top surface 142U of the first portion 142, and may be lower than the top surface 144U of the second portion 144. For example, the height of the top surface of the first source/drain contact 182a may be higher by D31 than the height of the top surface 142U of the first portion 142. Further, the height of the top surface of the first source/drain contact 182a may be lower by D32 than the height of the top surface 144U of the second portion 144. Accordingly, a difference in height between the top surface 142U of the first portion 142 and the top surface 144U of the second portion 144 may be D31+D32.

Although it is illustrated in FIG. 18 that each of the cross-sections of the second, third, fifth and sixth channel patterns 122b, 122c, 124b and 124c is circular, this is merely exemplary, and embodiments are not limited thereto. For example, the cross-sections of the second, third, fifth and sixth channel patterns 122b, 122c, 124b and 124c may be different from each other and polygonal (e.g., rectangular) or circular.

Figure 19:
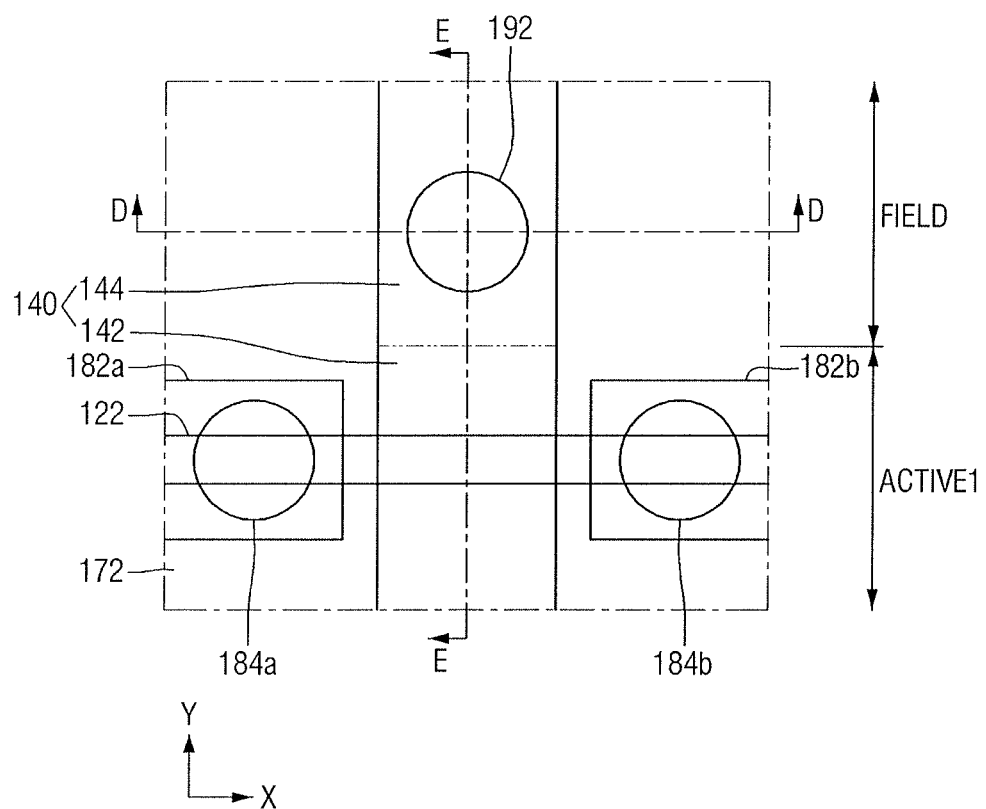
FIG. 19 illustrates a layout diagram of a semiconductor device according to some embodiments.
Figure 20:
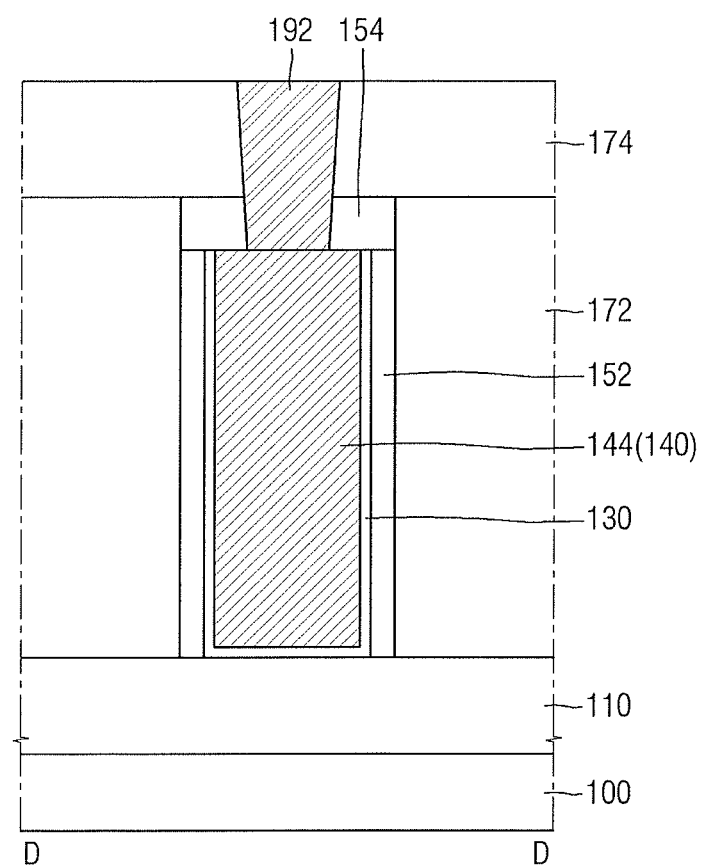
FIG. 20 illustrates a cross-sectional view taken along line D-D of FIG. 19.
Figure 21:
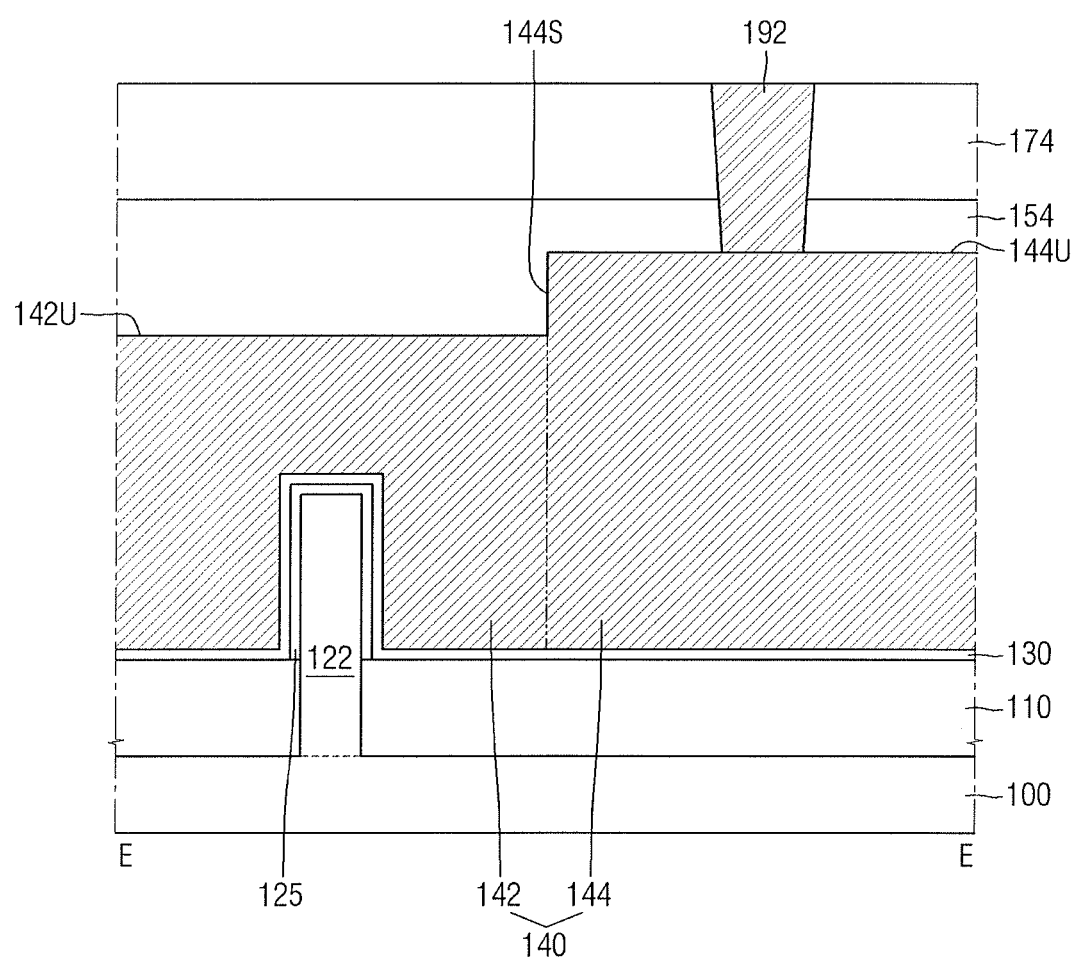
FIG. 21 illustrates a cross-sectional view taken along line E-E of FIG. 19.

FIG. 19 is a layout diagram illustrating a semiconductor device according to some embodiments. FIG. 20 is a cross-sectional view taken along line D-D of FIG. 19, and FIG. 21 is a cross-sectional view taken along line E-E of FIG. 19. For simplicity of description, a description overlapping with the description with reference to FIGS. 1 to 18 will be only briefly given or omitted.

Referring to FIGS. 19 to 21, in a semiconductor device according to some embodiments, the substrate 100 includes a first active region ACTIVE1 and a field region FIELD The field region FIELD may define the first active region ACTIVE1 of the substrate 100 on which active semiconductor devices, e.g., transistors, are formed. For example, an active pattern (e.g., the first active pattern 122 and/or the second active pattern 124 of FIG. 1) may not be formed in the field region FIELD.

In some embodiments, the first contact plug 192 may be formed on the field region FIELD of the substrate 100. For example, the first contact plug 192 may be connected to the second portion 144 overlapping the field insulating layer 110.

Figure 22:
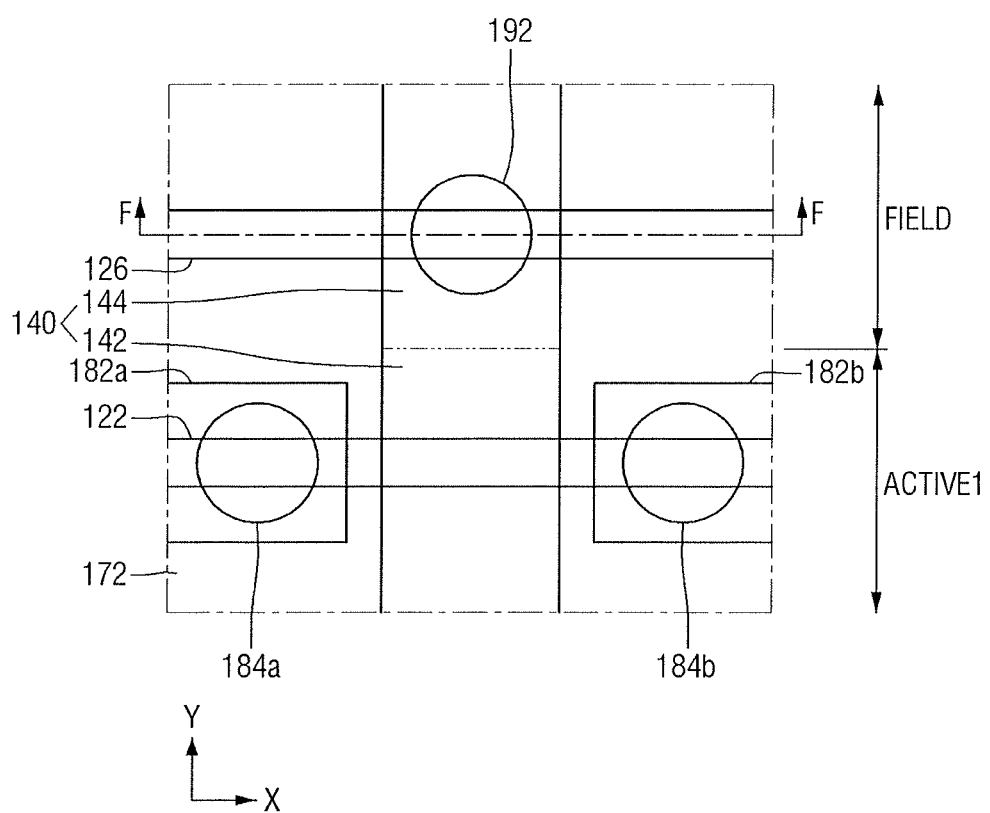
FIG. 22 illustrates a layout diagram of a semiconductor device according to some embodiments.
Figure 23:
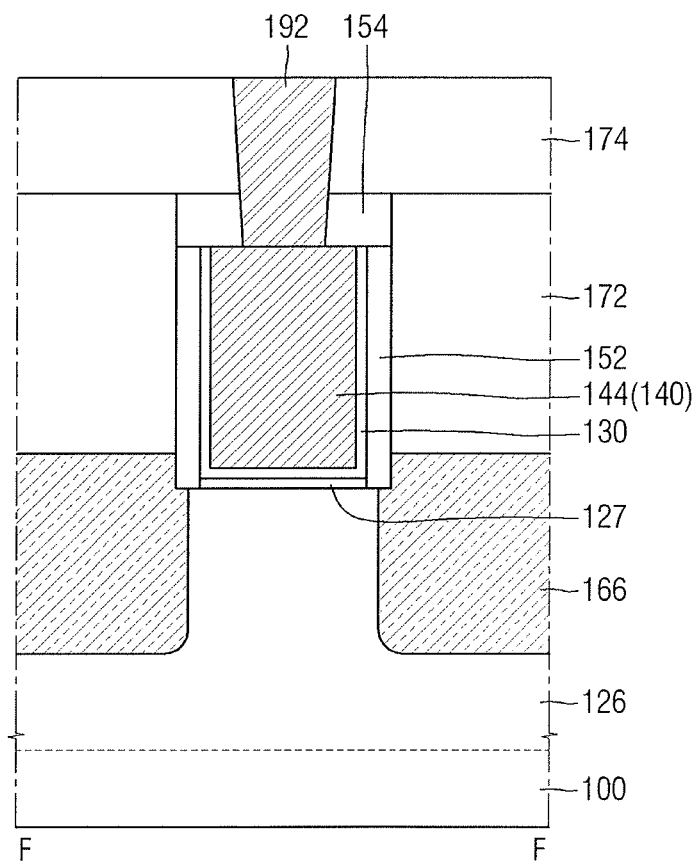
FIG. 23 illustrates a cross-sectional view taken along line F-F of FIG. 22.

FIG. 22 is a layout diagram illustrating a semiconductor device according to some embodiments. FIG. 23 is a cross-sectional view taken along line F-F of FIG. 22. For simplicity of description, a description overlapping with the description with reference to FIGS. 1 to 21 will be only briefly given or omitted.

Referring to FIGS. 22 and 23, a semiconductor device according to some embodiments further includes a dummy pattern 126. The dummy pattern 126 may be formed on the field region FIELD of the substrate 100. The dummy pattern 126 may not constitute an active semiconductor device such as a transistor. For example, the first source/drain contact 182a and the second source/drain contact 182b may not be connected to the third source/drain region 166 in the dummy pattern 126.

In some embodiments, the first contact plug 192 may overlap the dummy pattern 126. For example, the first contact plug 192 may be connected to the second portion 144 on the dummy pattern 126.

Figure 24:
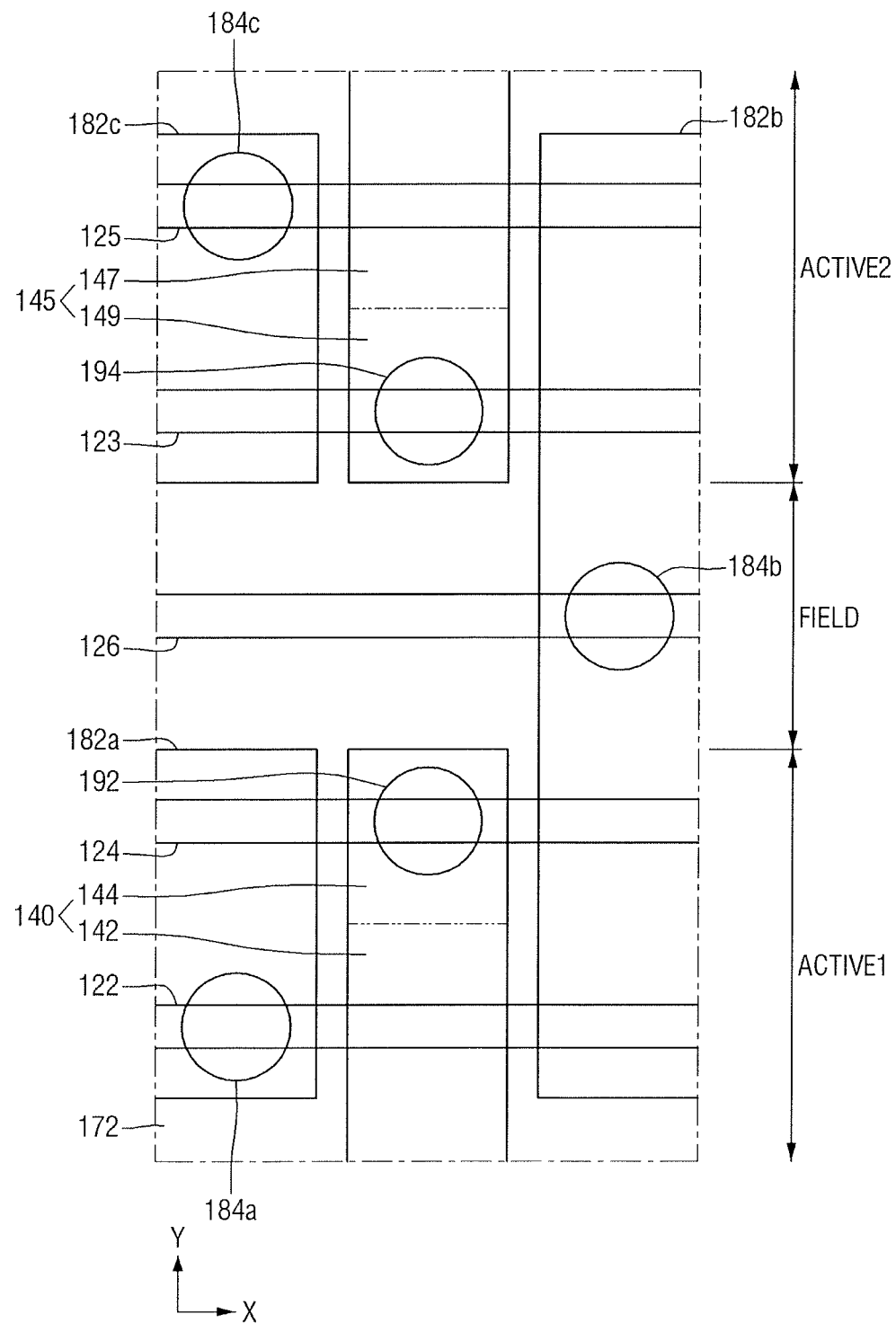
FIG. 24 illustrates a layout diagram of a semiconductor device according to some embodiments.
Figure 25:
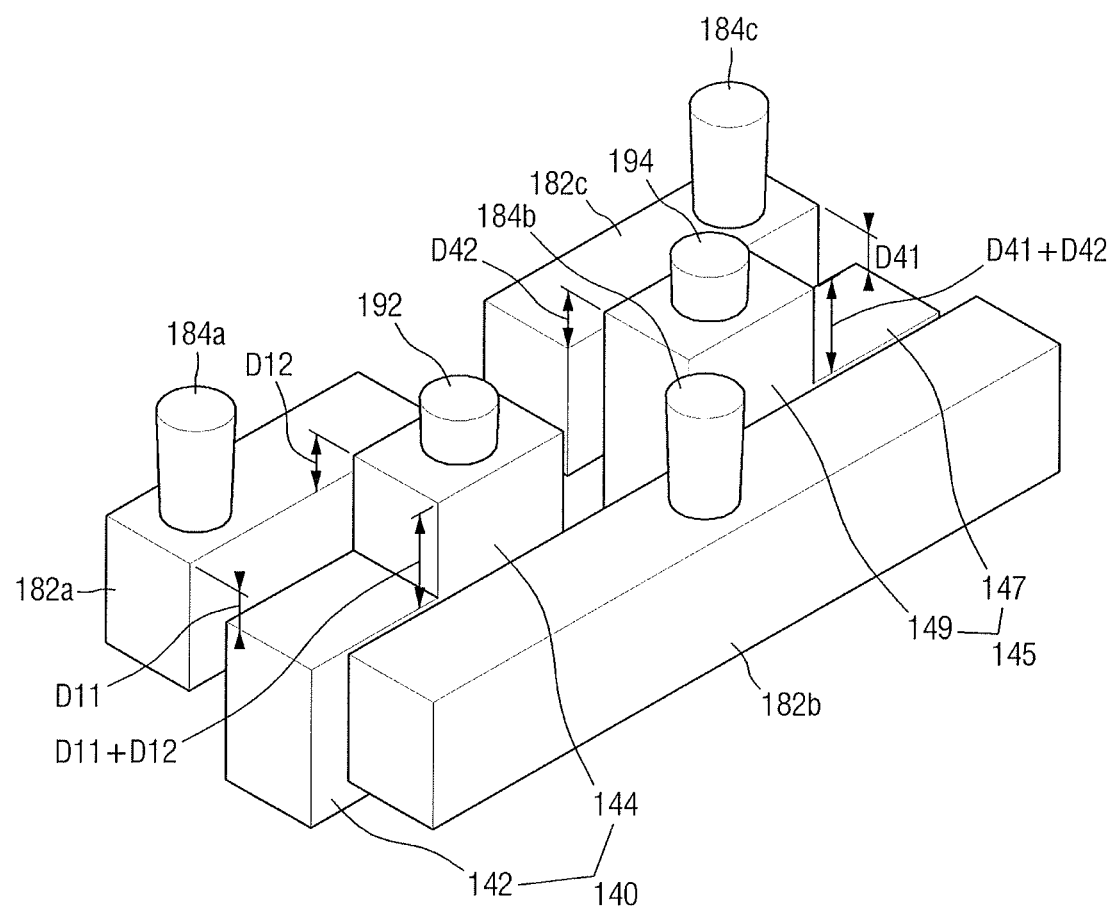
FIG. 25 illustrates a schematic perspective view of a gate electrode, a source/drain contact, and a contact plug of FIG. 24.

FIG. 24 is a layout diagram illustrating a semiconductor device according to some embodiments. FIG. 25 is a schematic perspective view illustrating the gate electrode, source/drain contact, and contact plug of FIG. 24. For simplicity of description, a description overlapping with the description with reference to FIGS. 1 to 23 will be only briefly given or omitted.

Referring to FIGS. 24 and 25, a semiconductor device according to some embodiments further includes a third active pattern 123, a fourth active pattern 128, a second gate electrode 145, a third source/drain contact 182c, a fourth contact plug 194, and a fifth contact plug 184c.

The substrate 100 may include a first active region ACTIVE1, a second active region ACTIVE2, and a field region FIELD. In some embodiments, the field region FIELD may be interposed between the first active region ACTIVE1 and the second active region ACTIVE2.

The third active pattern 123 and the fourth active pattern 128 may be formed on the second active region ACTIVE2 of the substrate 100. The third active pattern 123 and the fourth active pattern 128 may be elongated in the first direction X.

The second gate electrode 145 may intersect the third active pattern 123 and the fourth active pattern 128. For example, the second gate electrode 145 may be elongated in the second direction Y. In some embodiments, the first gate electrode 140 and the second gate electrode 145 may be arranged along the second direction Y.

The second gate electrode 145 may include a third portion 147 and a fourth portion 149, the top surfaces of which have different heights. For example, as shown in FIG. 25, the height of the top surface of the fourth portion 149 may be higher than the height of the top surface of the third portion 147.

In some embodiments, the fourth contact plug 194 may be formed on the second active region ACTIVE2 of the substrate 100. For example, the fourth contact plug 194 may overlap the third active pattern 123.

In some embodiments, the dummy pattern 126 may be interposed between the first gate electrode 140 and the second gate electrode 145. However, in some embodiments, the dummy pattern 126 may not intersect the first gate electrode 140 and the second gate electrode 145.

In some embodiments, the third contact plug 184b may overlap the dummy pattern 126. Accordingly, the third contact plug 184b may not be arranged along the first direction X with the first contact plug 192 and the fourth contact plug 194.

The third source/drain contact 182c may extend along one sidewall of the second gate electrode 145. In some embodiments, the third source/drain contact 182c may be connected to a source/drain region of the third active pattern 123 and a source/drain region of the fourth active pattern 128.

The first source/drain contact 182a and the third source/drain contact 182c may be arranged along the second direction Y. However, in some embodiments, the first source/drain contact 182a and the third source/drain contact 182c may be spaced from each other. For example, the first source/drain contact 182a and the third source/drain contact 182c may be spaced apart from each other with the dummy pattern 126 interposed therebetween.

The fifth contact plug 184c may be formed on the third source/drain contact 182c. The fifth contact plug 184c may be connected to the third source/drain contact 182c.

In some embodiments, the second source/drain contact 182b may extend further along the other sidewall of the second gate electrode 145. For example, the second source/drain contact 182b may intersect the third active pattern 123 and the fourth active pattern 128 beyond the dummy pattern 126. Thus, the second source/drain contact 182b may be connected to the source/drain region of the third active pattern 123 and the source/drain region of the fourth active pattern 128.

In some embodiments, the top surface of the second source/drain contact 182b and the top surface of the third source/drain contact 182c may be higher than the top surface of the third portion 147, and may be lower than the top surface of the fourth portion 149. For example, as shown in FIG. 25, the height of the top surface of the second source/drain contact 182b and the height of the top surface of the third source/drain contact 182c may be higher by D41 than the height of the top surface of the third portion 147. Further, the height of the top surface of the second source/drain contact 182b and the height of the top surface of the third source/drain contact 182c may be lower by D42 than the height of the top surface of the fourth portion 149. Accordingly, a difference in height between the top surface of the third portion 147 and the top surface of the fourth portion 149 may be D41+D42.

Hereinafter, a method of manufacturing a semiconductor device according to some embodiments will be described with reference to FIGS. 1 to 4 and 26 to 40.

FIGS. 26 to 40 are diagrams showing intermediate steps of a method for fabricating a semiconductor device according to some embodiments. FIGS. 26, 29, 32, 35 and 38 are cross-sectional views showing the intermediate steps, which are taken along line A-A of FIG. 1. FIGS. 27, 30, 33, 36 and 39 are cross-sectional views showing the intermediate steps, which are taken along line B-B of FIG. 1. FIGS. 28, 31, 34, 37 and 40 are cross-sectional views showing the intermediate steps, which are taken along line C-C of FIG. 1. For simplicity of description, a description overlapping with the description with reference to FIGS. 1 to 25 will be briefly given or omitted.

Figure 27:
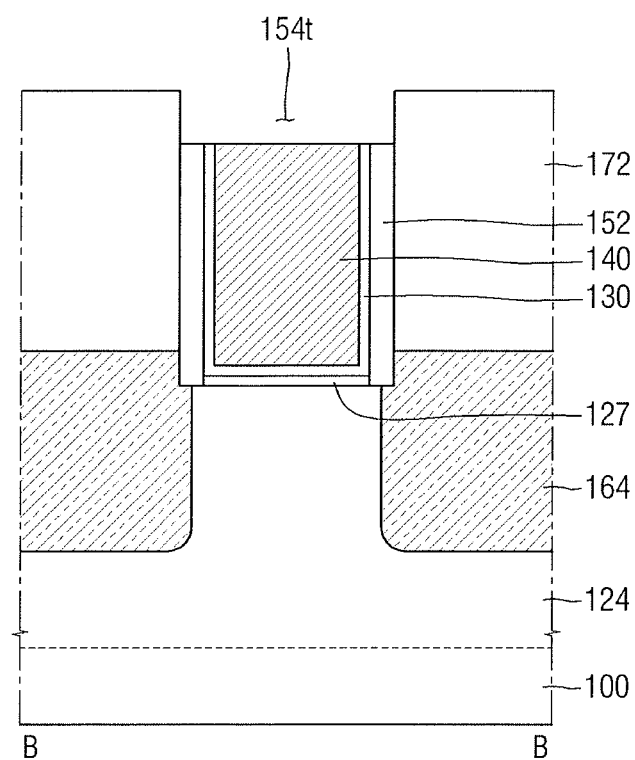
Figure 28:
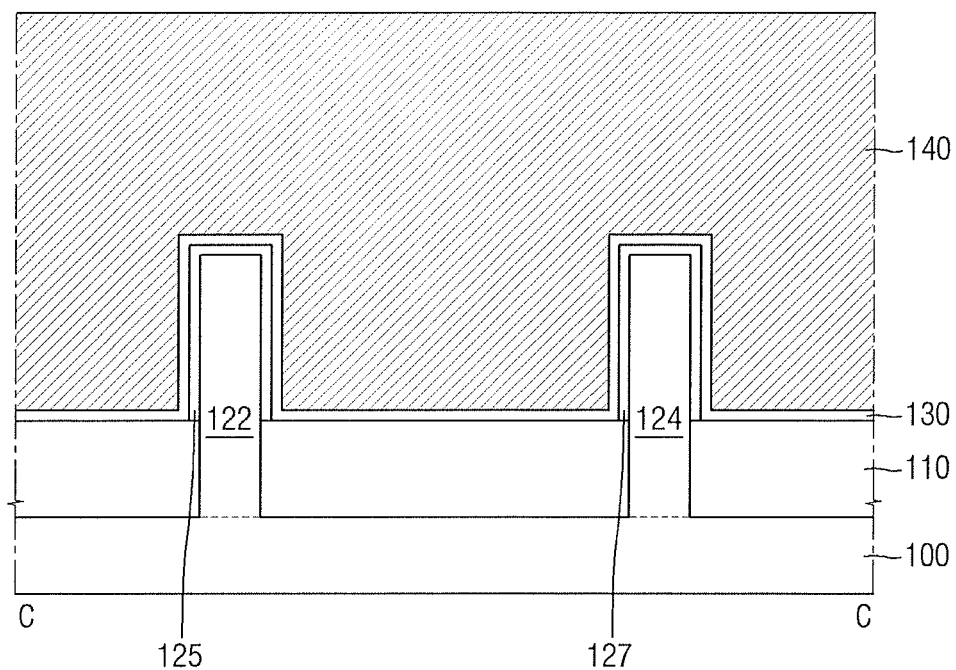

Referring to FIGS. 26 to 28, the first active pattern 122, the second active pattern 124, the field insulating layer 110, the first gate electrode 140, the gate dielectric layer 130, the gate spacers 152, the first source/drain region 162, the second source/drain region 164 and the first interlayer insulating film 172 are formed on the substrate 100.

The first active pattern 122 and the second active pattern 124 may be formed on the substrate 100. Further, the first active pattern 122 and the second active pattern 124 may be spaced apart from each other and extend in the first direction X.

The field insulating layer 110 may be formed on the substrate 100. In some embodiments, the field insulating layer 110 may cover a portion of the sidewalls of the first active pattern 122 and a portion of the sidewalls of the second active pattern 124.

The first gate electrode 140 may be formed on the first active pattern 122 and the second active pattern 124. The first gate electrode 140 may intersect the first active pattern 122 and the second active pattern 124. For example, the first gate electrode 140 may be elongated in the second direction Y.

The gate dielectric layer 130 may be interposed between the substrate 100 and the first gate electrode 140. For example, the gate dielectric layer 130 may extend along the sidewalls and bottom surface of the first gate electrode 140.

The gate spacers 152 may be formed on the substrate 100 and the field insulating layer 110. In addition, the gate spacers 152 may extend along both sidewalls of the first gate electrode 140.

The first interlayer insulating film 172 may be formed on the substrate 100. Further, the first interlayer insulating film 172 may be formed on the sidewalls of the gate spacers 152.

For example, the first interlayer insulating film 172 may cover the top surface of the field insulating layer 110, the top surface of the first source/drain region 162, the top surface of the second source/drain region 164 and the sidewalls of the gate spacers 152.

In some embodiments, a recess 154t may be formed in the first interlayer insulating film 172. The bottom surface of the recess 154t may be defined by the top surface of the first gate electrode 140. The recess 154t may be formed, e.g., by a recess process for the first gate electrode 140. However, in some embodiments, the formation of the recess 154t may be omitted.

Figure 29:
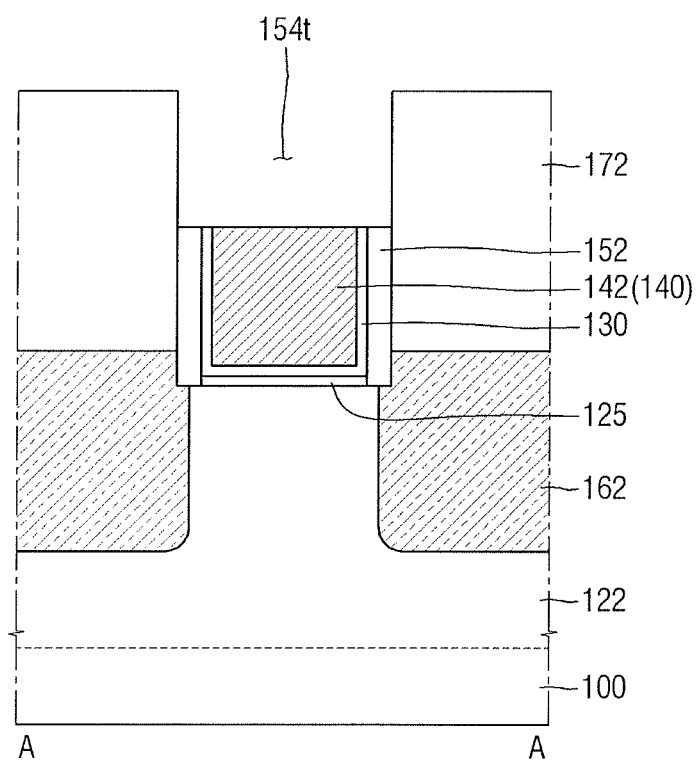
Figure 30:
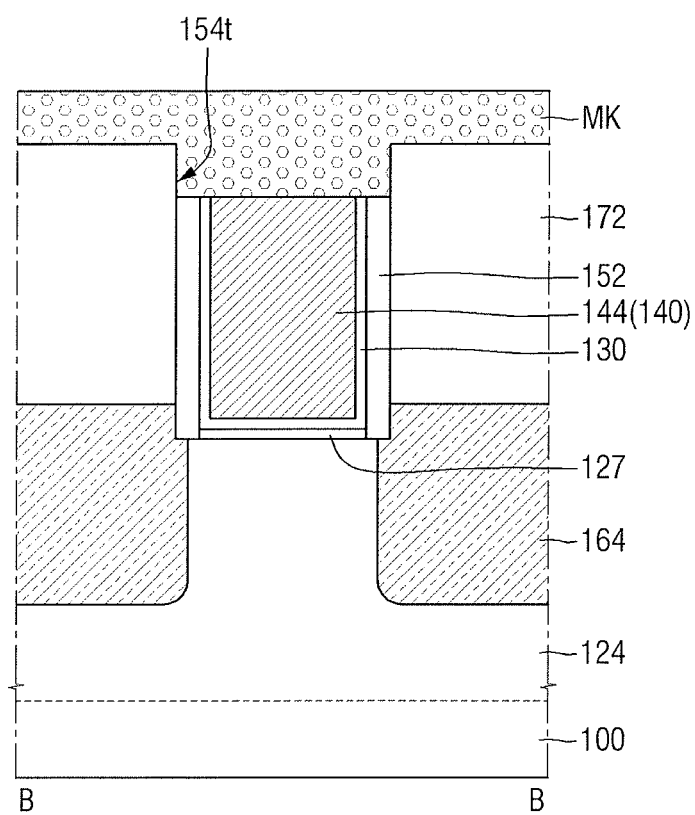
Figure 31:
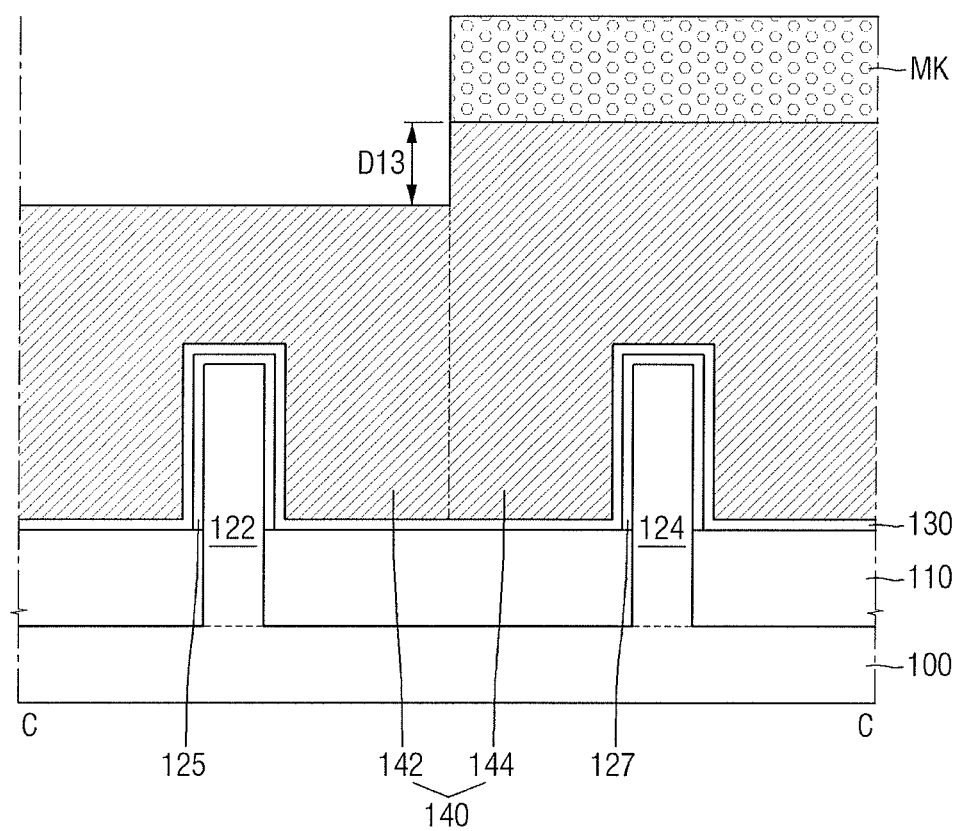

Referring to FIGS. 29 to 31, a part of the upper portion of the first gate electrode 140 is removed.

For example, a mask pattern MK which overlaps the second active pattern 124 and does not overlap the first active pattern 122 may be formed on the first gate electrode 140. Then, a recess process using the mask pattern MK as an etching mask may be performed. The recess process may remove a part of the upper portion of the first gate electrode 140.

Accordingly, the first gate electrode 140 may be formed to include the first portion 142 and the second portion 144 having different heights. For example, the height of the top surface of the second portion 144 may be higher by D13 than the height of the top surface of the first portion 142.

Figure 32:
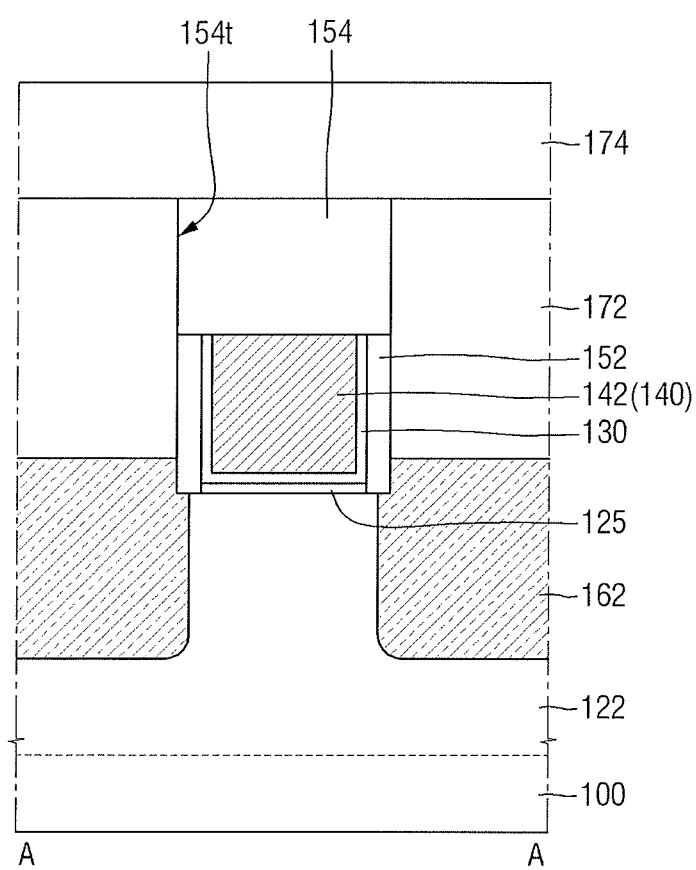
Figure 33:
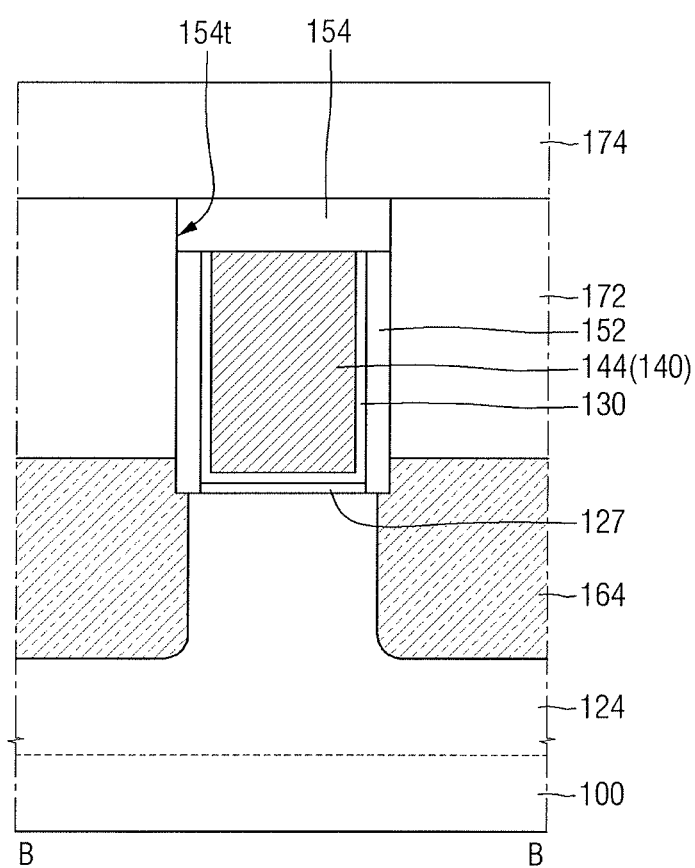
Figure 34:
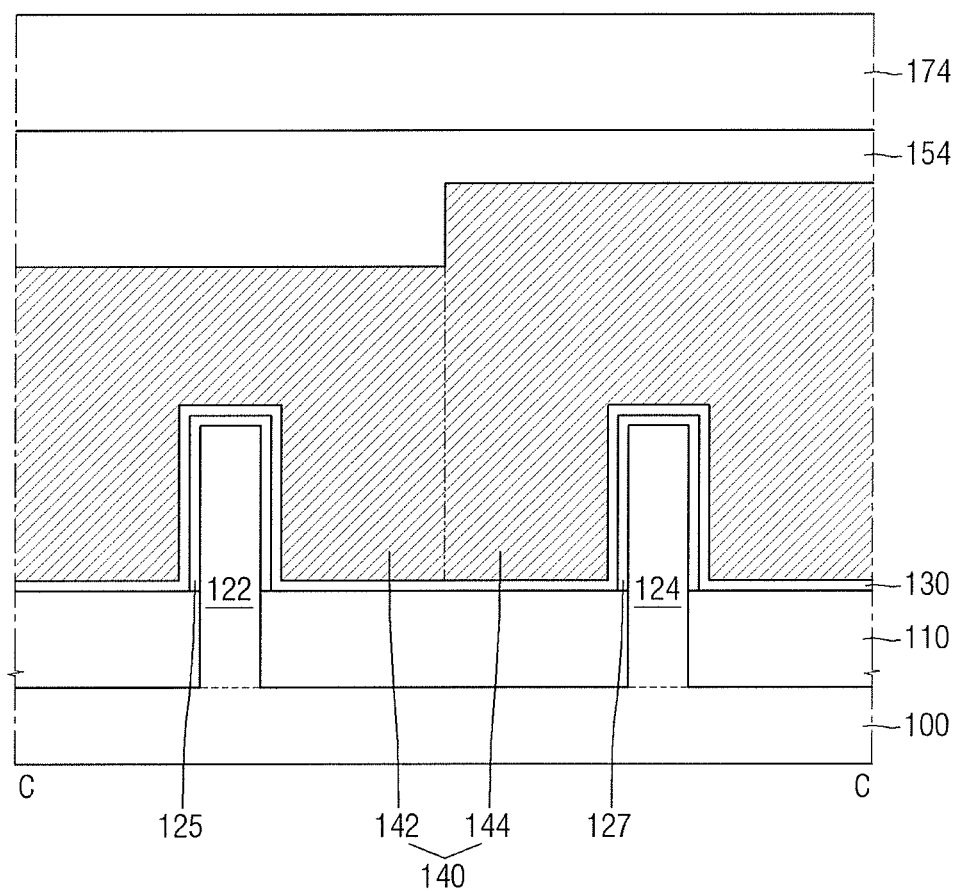

Referring to FIGS. 32 to 34, the gate capping pattern 154 and the second interlayer insulating film 174 are formed on the first gate electrode 140. The gate capping pattern 154 may be formed to fill the recess 154t. The second interlayer insulating film 174 may be formed to cover the gate capping pattern 154 and the first interlayer insulating film 172.

In some embodiments, the top surface of the gate capping pattern 154 may be disposed on the same plane with the top surface of the first interlayer insulating film 172. Accordingly, the thickness T11 of the gate capping pattern 154 on the first portion 142 may be greater than the thickness T12 of the gate capping pattern 154 on the second portion 144. This can be attributed to, e.g., a planarization process for the gate capping pattern 154, but embodiments are not limited thereto.

Figure 35:
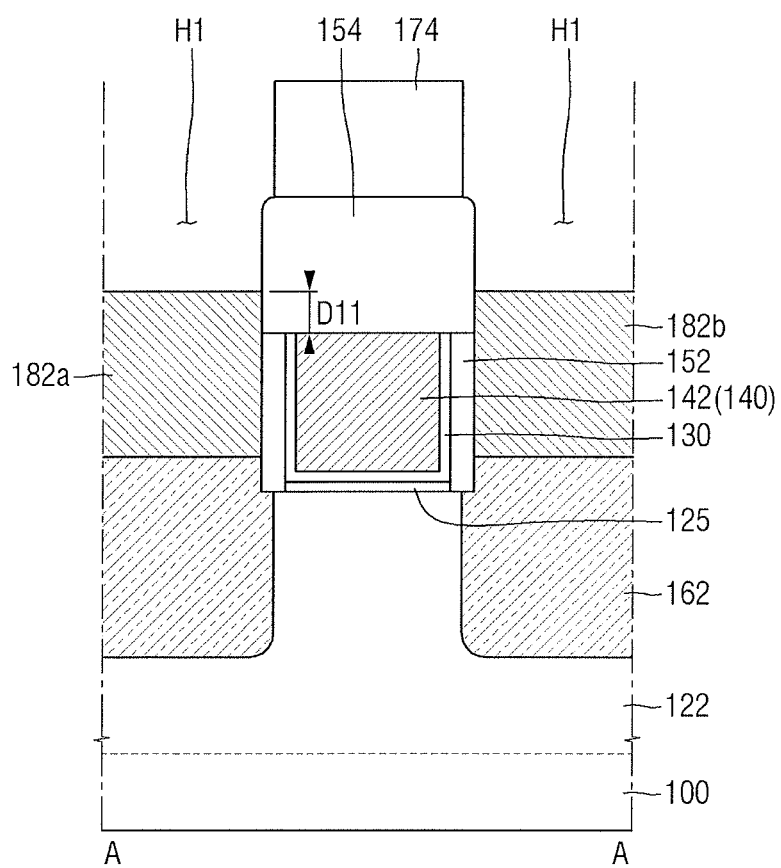
Figure 36:
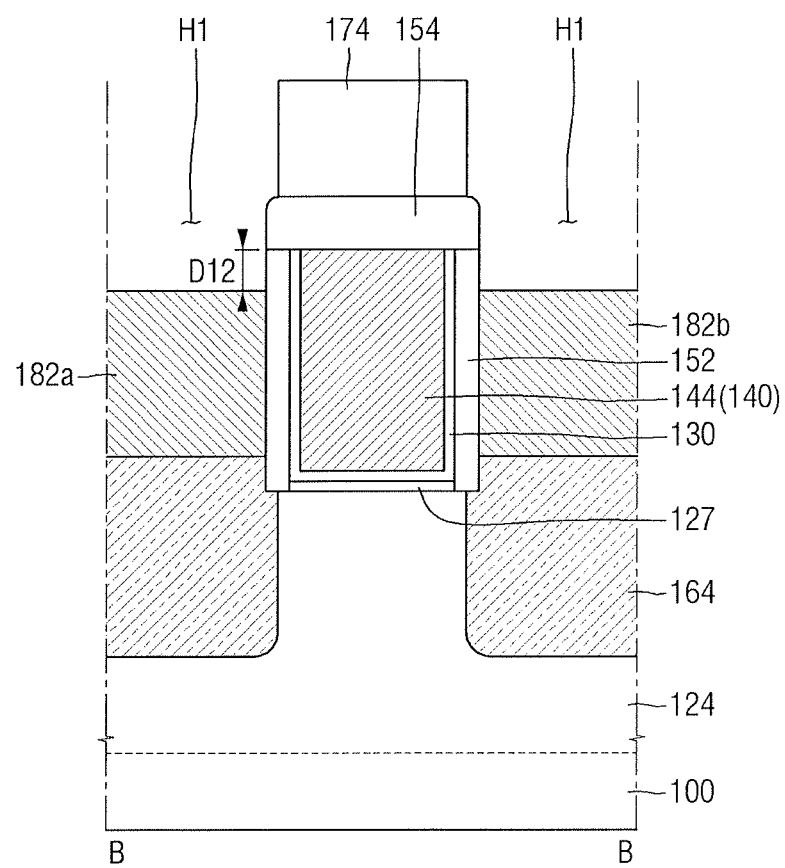
Figure 37:
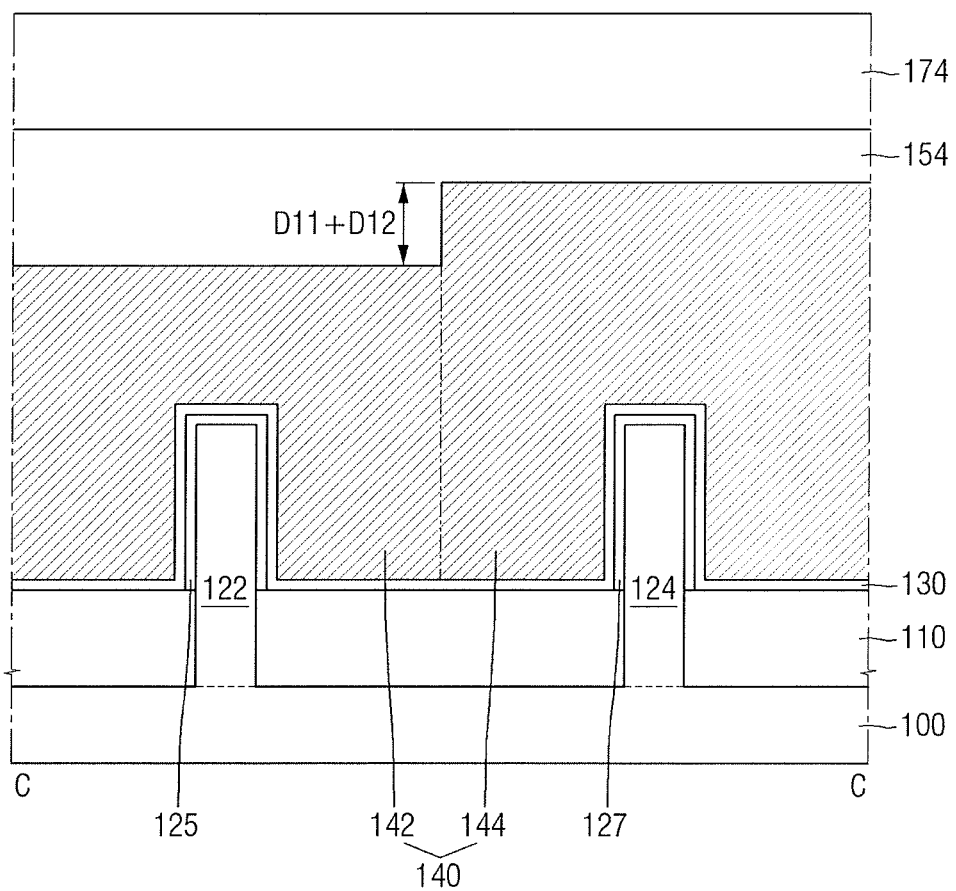

Referring to FIGS. 35 to 37, the first source/drain contact 182a and the second source/drain contact 182b are formed to be connected to the first source/drain region 162.

For example, the first contact hole 182t may be formed through the first interlayer insulating film 172 to expose the first source/drain region 162. Then, the first source/drain contact 182a and the second source/drain contact 182b may be formed to fill the first contact hole 182t.

In some embodiments, the top surface of the first source/drain contact 182a and the top surface of the second source/drain contact 182b may be higher than the top surface of the first portion 142 and may be lower than the top surface of the second portion 144. For example, a conductive film may be formed to fill the first contact hole 182t. Then, a recess process may be performed on the conductive film. The recess process may be performed until the top surface of the conductive film is higher than the top surface of the first portion 142 and lower than the top surface of the second portion 144.

Figure 38:
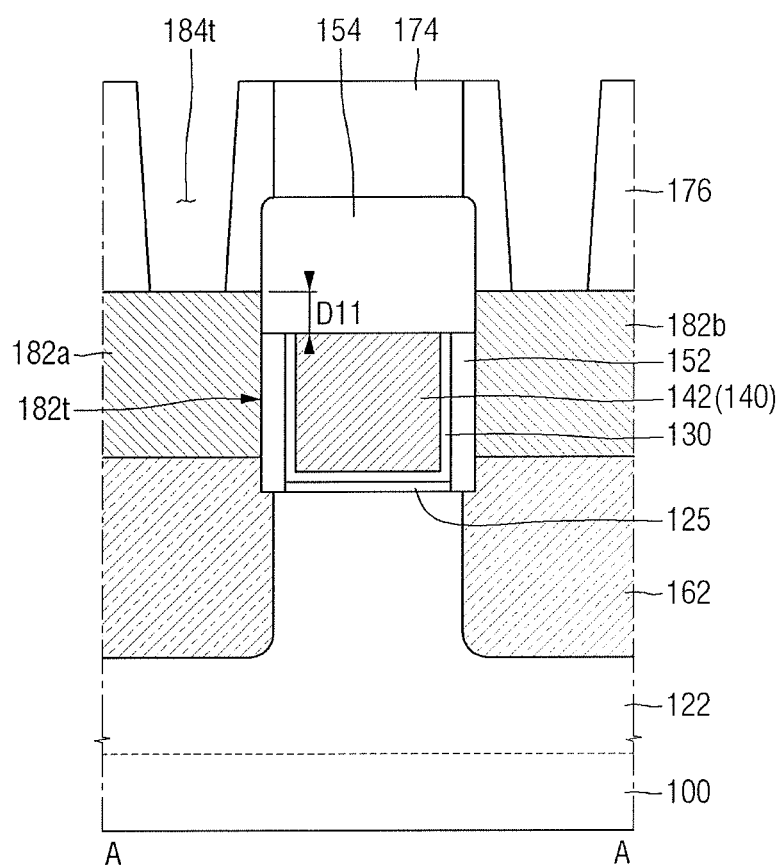
Figure 39:
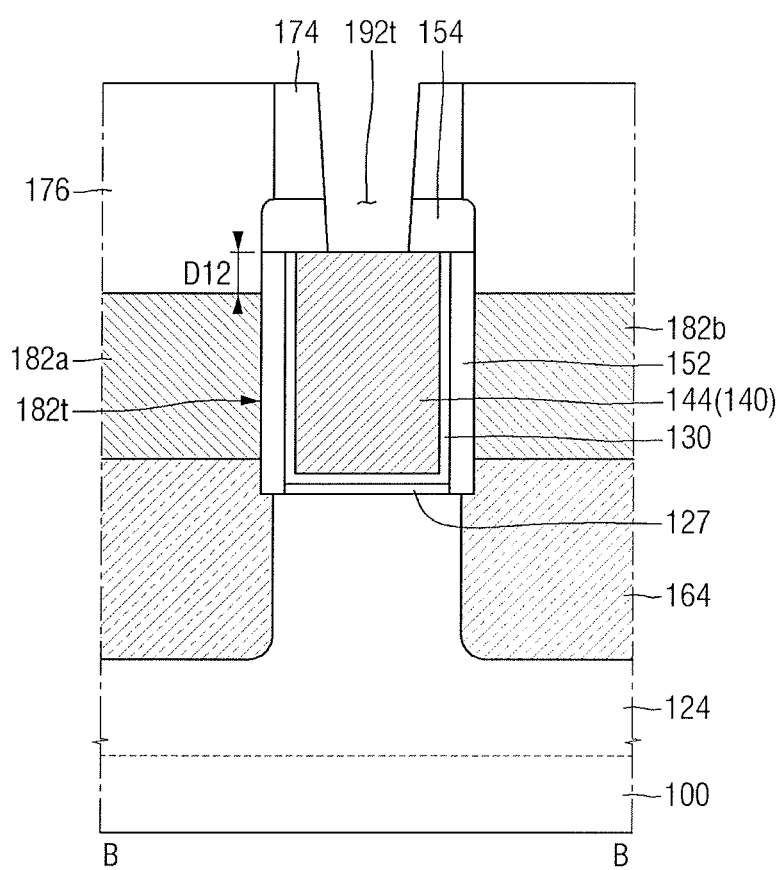
Figure 40:
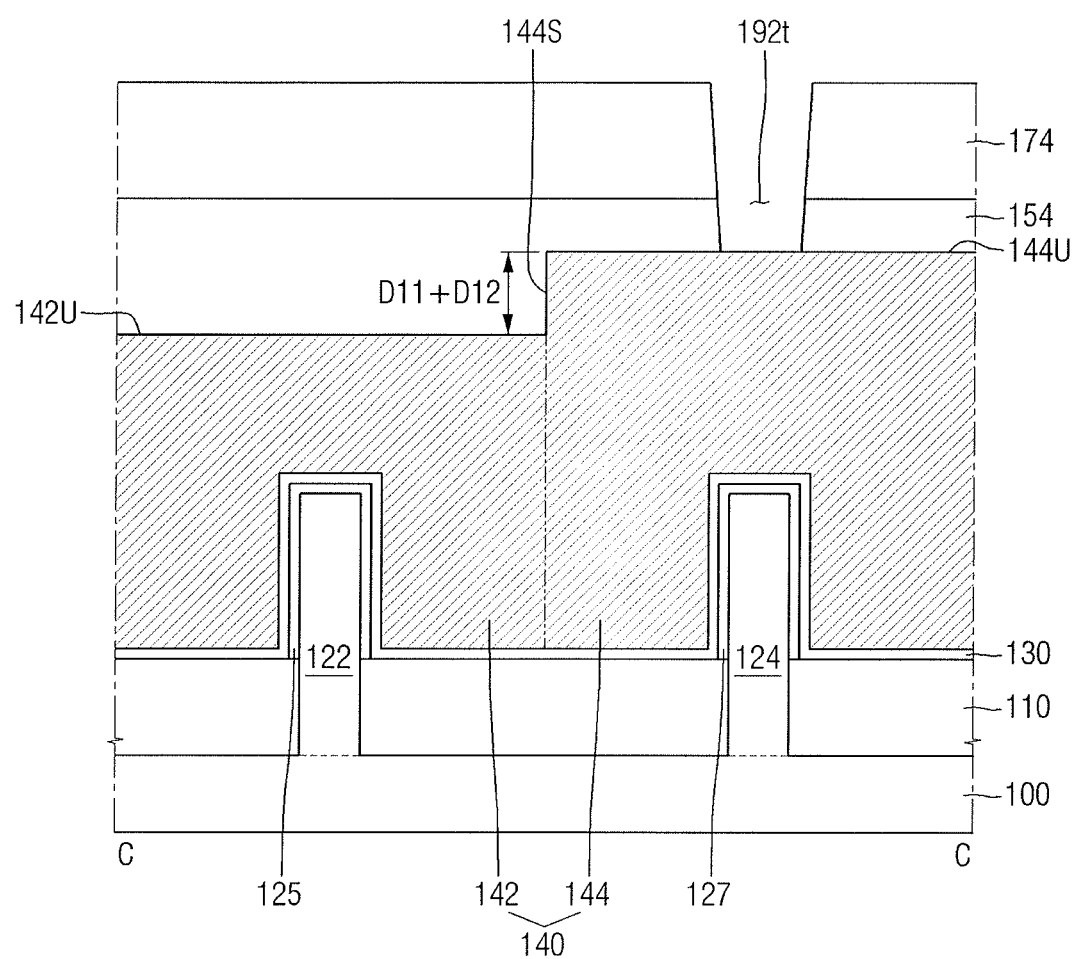

Referring to FIGS. 38 to 40, the second contact hole 192t and the third contact hole 184t are formed.

The second contact hole 192t may expose the second portion 144 of the first gate electrode 140. For example, the second contact hole 192t may sequentially pass through the second interlayer insulating film 174 and the gate capping pattern 154 to expose the top surface of the second portion 144.

The third contact hole 184t may expose the first source/drain contact 182a and the second source/drain contact 182b. For example, the filling insulating film 176 filling the remaining region of the first contact hole 182t may be formed on the first source/drain contact 182a and the second source/drain contact 182b. Then, the third contact hole 184t may be formed through the filling insulating film 176 to expose the top surface of the first source/drain contact 182a and the top surface of the second source/drain contact 182b.

In some embodiments, the second contact hole 192t and the third contact hole 184t may be formed at the same level.

Next, referring to FIGS. 2 to 4, the first contact plug 192, the second contact plug 184a, and the third contact plug 184b are formed. The first contact plug 192 may fill the second contact hole 192t. Accordingly, the first contact plug 192 connected to the second portion 144 of the first gate electrode 140 may be formed The second contact plug 184a and the third contact plug 184b may fill the third contact hole 184t. Accordingly, the second contact plug 184a connected to the first source/drain contact 182a and the third contact plug 184b connected to the second source/drain contact 182b may be formed.

By way of summation and review, aspects of the present disclosure provide a semiconductor device with improved product reliability and process margin. Aspects of the present disclosure also provide a method for fabricating a semiconductor device with improved product reliability and process margin.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    an active pattern on a substrate, the active pattern extending in a first direction;
    a gate electrode on the active pattern, the gate electrode extending in a second direction intersecting the first direction;
    a gate capping pattern extending along a top surface of the gate electrode;
    a first contact plug passing through the gate capping pattern, the first contact plug being connected to the top surface of the gate electrode;
    a source/drain region in the active pattern on a sidewall of the gate electrode; and
    a second contact plug on the source/drain region, the second contact plug being connected to the source/drain region,
    wherein the gate electrode includes a first portion arranged along the first direction with the second contact plug and a second portion arranged along the second direction with the first portion and directly connected to the first contact plug, and wherein a first thickness of the gate capping pattern on the first portion of the gate electrode is greater than a second thickness of the gate capping pattern on the second portion of the gate electrode.

2. The semiconductor device as claimed in claim 1, wherein a top surface of the gate capping pattern on the first portion of the gate electrode is disposed on a same plane as a top surface of the gate capping pattern on the second portion of the gate electrode.

3. The semiconductor device as claimed in claim 1, wherein a height of a bottom surface of the first contact plug is higher than a height of a bottom surface of the second contact plug.

4. The semiconductor device as claimed in claim 1, further comprising a source/drain contact between the source/drain region and the second contact plug, a height of a top surface of the source/drain contact being higher than a height of a top surface of the first portion of the gate electrode and lower than a height of a top surface of the second portion of the gate electrode.

5. The semiconductor device as claimed in claim 1, further comprising a gate spacer extending along the sidewall of the gate electrode, a sidewall of the second contact plug being spaced apart from a sidewall of the gate spacer.

6. The semiconductor device as claimed in claim 1, wherein a sidewall of the second contact plug is spaced apart from a sidewall of the gate capping pattern.

7. The semiconductor device as claimed in claim 1, wherein the active pattern includes a fin-shaped pattern protruding from a top surface of the substrate and extending in the first direction.

8. The semiconductor device as claimed in claim 1, wherein the active pattern includes a wire pattern spaced apart from the substrate and extending in the first direction.

9. The semiconductor device as claimed in claim 1, wherein the active pattern includes a first channel pattern and a second channel pattern spaced apart from each other and extending in the first direction.

10. A semiconductor device, comprising:
an active pattern on a substrate, the active pattern extending in a first direction;
a gate electrode on the active pattern, a longitudinal direction of the gate electrode extending in a second direction intersecting the first direction, and the gate electrode including a first portion and a second portion arranged adjacent to each other along the second direction;
a first contact plug connected to a top surface of the second portion of the gate electrode, a portion of the first contact plug not overlapping with the second portion of the gate electrode;
a source/drain region in the active pattern on a sidewall of the gate electrode; and
a source/drain contact connected to the source/drain region,
wherein a height of a top surface of the first portion of the gate electrode is lower than a height of the top surface of the second portion of the gate electrode, and
wherein a height of a bottom surface of the first contact plug is higher than a height of a top surface of the source/drain contact.

11. The semiconductor device as claimed in claim 10, further comprising a gate spacer extending along the sidewall of the gate electrode, the portion of the first contact plug overlapping with the gate spacer.

12. The semiconductor device as claimed in claim 10, further comprising a second contact plug on the source/drain contact, the second contact plug being connected to the top surface of the source/drain contact.

13. The semiconductor device as claimed in claim 12, wherein a height of a bottom surface of the second contact plug is higher than the height of the top surface of the first portion of the gate electrode.

14. The semiconductor device as claimed in claim 13, wherein a portion of the second contact plug does not overlap with the source/drain contact.

15. The semiconductor device as claimed in claim 14, further comprising a gate spacer extending along the sidewall of the gate electrode, the portion of the second contact plug overlapping with the gate spacer.

16. A semiconductor device, comprising:
a plurality of channel patterns sequentially disposed on a substrate and spaced apart from each other, each of the plurality of channel patterns extending in a first direction;
a gate electrode on the substrate, the gate electrode extending in a second direction intersecting the first direction, each of the plurality of channel patterns passing through the gate electrode, and the gate electrode including a first portion and a second portion arranged adjacent to each other along the second direction;
a first contact plug on the gate electrode, the first contact plug being connected to a top surface of the second portion of the gate electrode;
a source/drain region on a sidewall of the gate electrode, the source/drain region being connected to the plurality of channel patterns; and
a source/drain contact on the source/drain region, a height of a top surface of the source/drain contact being higher than a top surface of the first portion of the gate electrode and lower than the top surface of the second portion of the gate electrode.

17. The semiconductor device as claimed in claim 16, further comprising a second contact plug on the source/drain contact, the second contact plug being connected to the top surface of the source/drain contact, and a height of a bottom surface of the second contact plug being higher than a height of the top surface of the first portion of the gate electrode.

18. The semiconductor device as claimed in claim 16, wherein a height of a bottom surface of the first contact plug is higher than the height of the top surface of the source/drain contact.

19. The semiconductor device as claimed in claim 16, further comprising, on the gate electrode, a gate capping pattern extending in the second direction, the first contact plug being connected to the top surface of the second portion of the gate electrode through the gate capping pattern, and a thickness of a first portion of the gate capping pattern on the first portion of the gate electrode being greater than a thickness of a second portion of the gate capping pattern on the second portion of the gate electrode.

20. The semiconductor device as claimed in claim 16, wherein the source/drain contact extends in the second direction.

* * * * *